US012763116B2

(12) United States Patent
Kim et al.

(10) Patent No.: US 12,763,116 B2
(45) Date of Patent: Oct. 13, 2026

(54) NON-VOLATILE MEMORY DEVICE

(71) Applicant: Samsung Electronics Co., Ltd., Suwon-si (KR)

(72) Inventors: Seungyeon Kim, Suwon-si (KR); Daeseok Byeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 159 days.

(21) Appl. No.: 18/104,533

(22) Filed: Feb. 1, 2023

(65) Prior Publication Data

US 2023/0267975 A1 Aug. 24, 2023

(30) Foreign Application Priority Data

Feb. 18, 2022 (KR) ........................ 10-2022-0021732
Jul. 13, 2022 (KR) ........................ 10-2022-0086547

(51) Int. Cl.
*G11C 7/10* (2006.01)
*G11C 5/06* (2006.01)

(52) U.S. Cl.
CPC ............ *G11C 7/1039* (2013.01); *G11C 5/063* (2013.01); *G11C 7/1069* (2013.01)

(58) Field of Classification Search
CPC .................................................... G11C 7/1039
USPC .................................................... 365/189.05
See application file for complete search history.

(56) References Cited

U.S. PATENT DOCUMENTS 6,963,502 B2 11/2005 Park
7,684,256 B2 3/2010 Kim
7,817,470 B2 10/2010 Kim
7,889,555 B2 2/2011 Lee et al.
11,200,002 B2 12/2021 Choi et al.
2006/0209601 A1* 9/2006 Kim ....................... G11C 16/24 365/189.05
2006/0239073 A1 10/2006 Toda
2012/0099390 A1* 4/2012 Cho ..................... G11C 7/1048 365/207
2013/0145093 A1* 6/2013 Kaminaga ............ G11C 7/1051 711/E12.001
2013/0201744 A1* 8/2013 Pagliato ............. G11C 29/1201 365/63
2017/0330624 A1 11/2017 Lim et al.
2019/0115361 A1 4/2019 Kim et al.

(Continued)

OTHER PUBLICATIONS

Extended European Search Report issued Jul. 24, 2023 for corresponding EP Patent Application No. 23155349.6.

(Continued)

*Primary Examiner* — Anthan Tran
(74) *Attorney, Agent, or Firm* — Muir Patent Law, PLLC

(57) ABSTRACT

A non-volatile memory device includes a first semiconductor layer including a first cell region in which a first memory cell array is disposed, a second cell region in which a second memory cell array is disposed, wherein the first memory cell array and the second memory cell array each include a plurality of word lines, a plurality of memory cells, and a plurality of bit lines, and a second semiconductor layer including a page buffer circuit region in which a page buffer circuit connected to the first memory cell array and the second memory cell array is disposed, wherein the page buffer circuit region overlaps a boundary region between the first cell region and the second cell region when viewed from the vertical direction.

20 Claims, 34 Drawing Sheets

(56) References Cited

U.S. PATENT DOCUMENTS

| | | | | |
|---|---|---|---|---|
| 2020/0411542 | A1 | 12/2020 | Yang et al. | |
| 2021/0057360 | A1 | 2/2021 | Oh et al. | |
| 2021/0066282 | A1 | 3/2021 | Kim et al. | |
| 2021/0217763 | A1 | 7/2021 | Lee | |
| 2021/0375901 | A1* | 12/2021 | Oh | H10B 43/40 |
| 2021/0383874 | A1 | 12/2021 | Oh et al. | |
| 2022/0020404 | A1 | 1/2022 | Cho et al. | |
| 2022/0028461 | A1* | 1/2022 | Lee | G11C 16/10 |

OTHER PUBLICATIONS

Second Office Action dated Feb. 5, 2025 for corresponding application No. EP 23155349.6.

* cited by examiner

NON-VOLATILE MEMORY DEVICE

CROSS-REFERENCE TO RELATED APPLICATIONS

This application is based on and claims priority under 35 U.S.C. § 119 to Korean Patent Application Nos. 10-2022-0021732, filed on Feb. 18, 2022, and 10-2022-0086547, filed on Jul. 13, 2022, in the Korean Intellectual Property Office, the disclosures of which are incorporated by reference herein in their entireties.

BACKGROUND

The present disclosure relates to a memory device, and more particularly, to a non-volatile memory device in which a plurality of memory cell arrays share a page buffer circuit.

Memory devices are used to store data and are categorized into volatile memory devices and non-volatile memory devices. In response to the demand for increased capacity and miniaturization of non-volatile memory devices, a 3-dimensional memory device in which a memory cell array and peripheral circuits are arranged in a vertical direction has been developed. As the number of word lines stacked on a substrate increases to increase the capacity of a non-volatile memory device, the area of a cell region in which a memory cell array is disposed may decrease. For miniaturization of a non-volatile memory device, it is important to reduce the area of a peripheral circuit region in which peripheral circuits are arranged under a memory cell array.

SUMMARY

The present disclosure provides a non-volatile memory device including a page buffer circuit shared by a first memory cell array and a second memory cell array.

According to an aspect of the inventive concept, a non-volatile memory device includes a first semiconductor layer including a first cell region in which a first memory cell array is disposed, a second cell region in which a second memory cell array is disposed, and a first metal pad layer, wherein the first memory cell array and the second memory cell array each include a plurality of word lines stacked in a vertical direction, a plurality of memory cells respectively connected to the plurality of word lines, and a plurality of bit lines, and a second semiconductor layer including a page buffer circuit region in which a page buffer circuit connected to the first memory cell array and the second memory cell array is disposed and a second metal pad layer, wherein the second semiconductor layer is connected to the first semiconductor layer in the vertical direction through bonding by the first metal pad layer and the second metal pad layer, wherein the page buffer circuit region overlaps a boundary region between the first cell region and the second cell region when viewed from the vertical direction.

According to another aspect of the inventive concept, a non-volatile memory device includes a first semiconductor layer including a first cell region in which a first memory cell array is disposed and a second cell region in which a second memory cell array is disposed, wherein the first memory cell array and the second memory cell array each includes a plurality of word lines stacked in a vertical direction, a plurality of memory cells respectively connected to the plurality of word lines, and a plurality of bit lines, and a second semiconductor layer disposed under the first semiconductor layer and including a page buffer circuit region in which a page buffer circuit connected to the first memory cell array and the second memory cell array is disposed, wherein the page buffer circuit is connected to a first bit line of the first memory cell array and a second bit line of the second memory cell array in common.

According to another aspect of the inventive concept, a non-volatile memory device includes a first memory cell array including a plurality of word lines and a plurality of first bit lines, a second memory cell array including a plurality of word lines and a plurality of second bit lines, and a page buffer circuit shared by the first memory cell array and the second memory cell array, wherein the page buffer circuit includes a first switch connected to a first bit line of the first memory cell array, a second switch connected to a second bit line of the second memory cell array, and a page buffer including a sensing latch connected to the first switch and the second switch in common.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
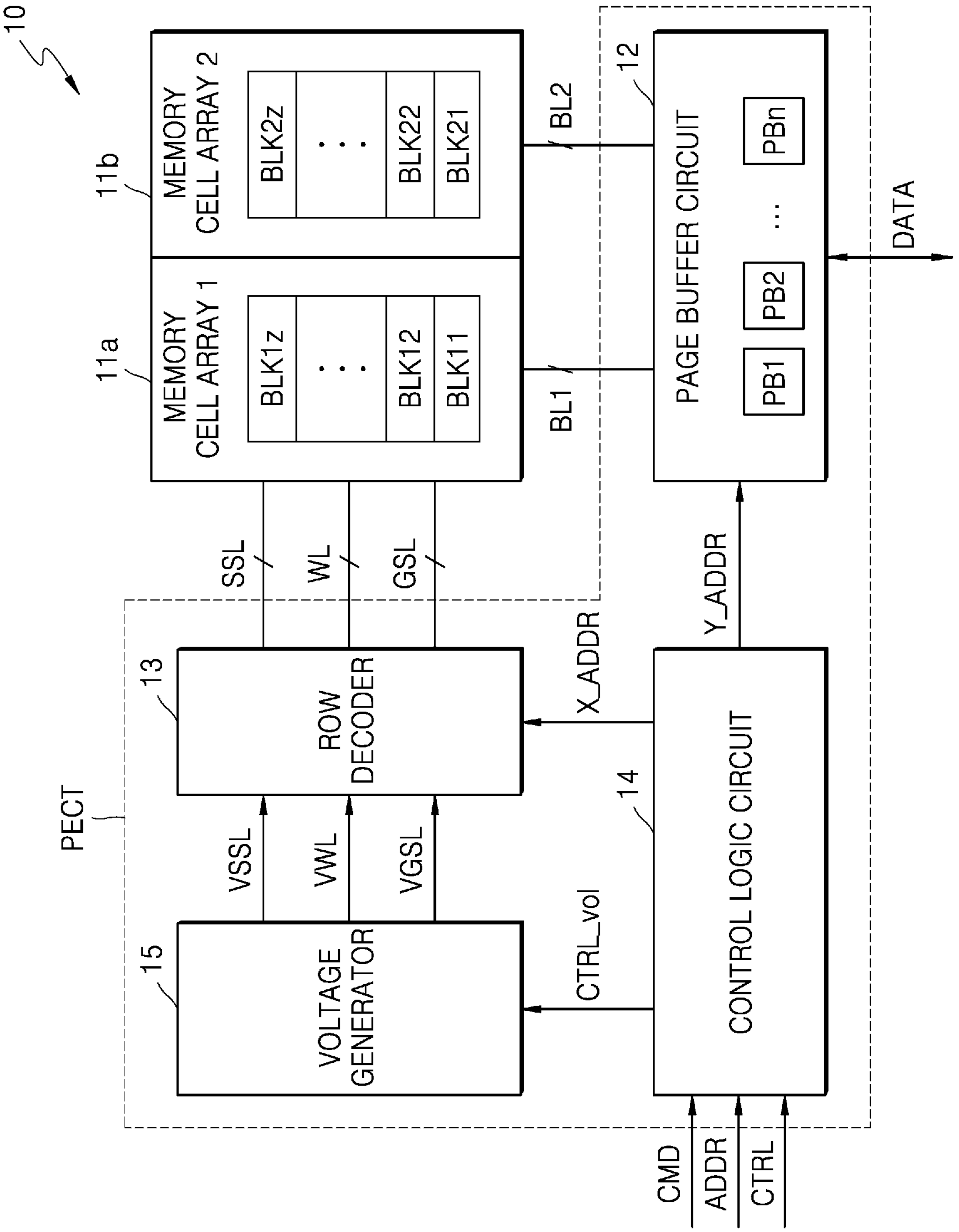
FIG. 1 is a block diagram showing the memory device 10 according to an embodiment.

FIG. 1 is a block diagram showing the memory device 10 according to an embodiment.

Referring to FIG. 1, the memory device 10 may include a first memory cell array 11*a*, a second memory cell array 11*b*, and a peripheral circuit PECT, and the peripheral circuit PECT may include a page buffer circuit 12, a row decoder 13, a control logic circuit 14, and a voltage generator 15. Although not shown in FIG. 1, the peripheral circuit PECT may further include a data input/output circuit, an input/output interface, etc. Also, the peripheral circuit PECT may further include a pre-decoder, a temperature sensor, a command decoder, an address decoder, etc. In the present specification, the memory device 10 may refer to a "non-volatile memory device," and may include one or more semiconductor substrates including integrated circuits formed therein and thereon.

The first memory cell array 11*a* may include a plurality of memory blocks BLK11 to BLK1*z*, and the second memory cell array 11*b* may include a plurality of memory blocks BLK21 to BLK2*z* (z is a positive integer). The plurality of memory blocks BLK11 to BLK1*z* and the plurality of memory blocks BLK21 to BLK2*z* may each include a plurality of memory cells. The first memory cell array 11*a* may be connected to the page buffer circuit 12 through first bit lines BL1, and the second memory cell array 11*b* may be connected to the page buffer circuit 12 through second bit lines BL2. According to an embodiment, the first memory cell array 11*a* and the second memory cell array 11*b* may share the page buffer circuit 12. The first memory cell array 11*a* and the second memory cell array 11*b* may each be connected to the row decoder 13 through word lines WL, string select lines SSL, and ground select lines GSL. Although not shown, the row decoder 13 may include a first row decoder connected to the word lines WL, the string select lines SSL, and the ground select lines GSL of the first memory cell array 11*a* and a second row decoder connected to the word lines WL, the string select lines SSL, and the ground select lines GSL of the second memory cell array 11*b*. The memory cells may be flash memory cells. Hereinafter, embodiments will be described in detail based on an example case where the memory cells are NAND flash memory cells. However, the inventive concept is not limited thereto, and, according to some embodiments, the memory cells may be resistive memory cells like resistive RAM (ReRAM) cells, phase change RAM (PRAM) cells, and magnetic RAM (MRAM) cells.

According to an embodiment, the first memory cell array 11*a* and the second memory cell array 11*b* may each include or be a 3-dimensional memory cell array. The 3-dimensional memory cell array may include a plurality of NAND strings, and each NAND string may include memory cells respectively connected to word lines vertically stacked on a substrate. Detailed descriptions thereof will be given later with reference to FIGS. 2, 3A, and 3B. U.S. Pat. Nos. 7,679,133, 8,553,466, 8,654,587, 8,559,235, and U.S. Patent Application Publication No. 2011/0233648 disclose detailed suitable configurations for a 3-dimensional memory array including multiple levels and in which word lines and/or bit lines are shared between the levels, and are incorporated herein by reference in their entirety. However, the inventive concept is not limited thereto. In some embodiments, the first memory cell array 11*a* and the second memory cell array 11*b* may include a 2-dimensional memory cell array, and the 2-dimensional memory cell array may include a plurality of NAND cells arranged in a row-wise direction and a column-wise direction.

The page buffer circuit 12 may include a plurality of page buffers PB1 to PBn, where n is a positive integer. The plurality of page buffers PB1 to PBn may be connected to memory cells of the first memory cell array 11*a* and the second memory cell array 11*b* through corresponding bit lines. The page buffer circuit 12 may select at least one bit line from among the first bit lines BL1 and the second bit lines BL2 under the control of the control logic circuit 14. For example, the page buffer circuit 12 may select some bit lines from among the first bit lines BL1 and the second bit lines BL2 in response to a column address Y_ADDR received from the control logic circuit 14.

The plurality of page buffers PB1 to PBn may each operate as a write driver or a sense amplifier. For example, in a program operation, the plurality of page buffers PB1 to PBn may each store data DATA to be programmed in memory cells by applying a voltage corresponding to the data DATA to a bit line. For example, in a program verify operation or a read operation, the plurality of page buffers PB1 to PBn may each sense programmed data DATA by sensing a current or a voltage through a bit line. Each page buffer of the plurality of page buffers PB1 to PBn may also be referred to as a page buffer sub-circuit.

The control logic circuit 14 may output various control signals, e.g., a voltage control signal CTRL_vol, a row address X_ADDR, and a column address Y_ADDR, for programming data to the first memory cell array 11*a* or the second memory cell array 11*b*, reading data from the first memory cell array 11*a* and the second memory cell array 11*b*, or erasing data stored in the first memory cell array 11*a* or the second memory cell array 11*b*, based on a command CMD, an address ADDR, and a control signal CTRL. Therefore, the control logic circuit 14 may overall control various operations within the memory device 10. For example, the control logic circuit 14 may receive a command CMD, an address ADDR, and a control signal CTRL from a memory controller.

The voltage generator 15 may generate various types of voltages for performing a program operation, a read operation, and an erase operation on the first memory cell array 11*a* or the second memory cell array 11*b* based on the voltage control signal CTRL_Vol. In detail, the voltage generator 15 may generate a word line voltage VWL, e.g., a program voltage, a read voltage, a pass voltage, an erase verify voltage, or a program verify voltage. Also, the voltage generator 15 may further generate a string select line voltage and a ground select line voltage based on the voltage control signal CTRL_Vol.

The row decoder 13 may select one of the plurality of memory blocks BLK11 to BLK1*z* and the plurality of memory blocks BLK21 to BLK2*z* in response to a row address X_ADDR received from the control logic circuit 14, select one of the word lines WL of a selected memory block, and select one of the plurality of string select lines SSL. For example, the row decoder 13 may apply a program voltage and a program verify voltage to a selected word line during a program operation and may apply a read voltage to a selected word line during a read operation.

Figure 3A:
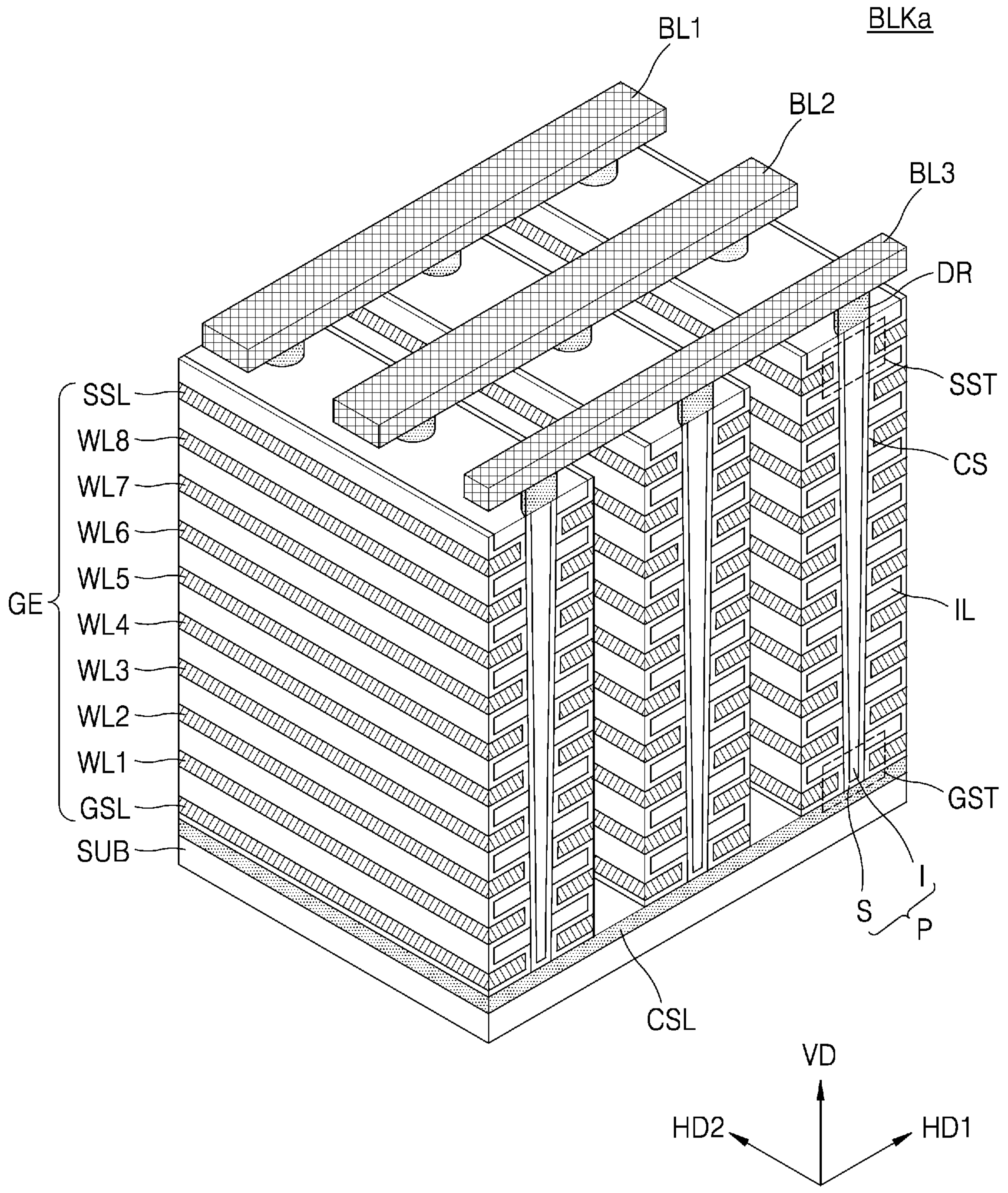
FIGS. 3A and 3B are perspective views of a memory block BLKa and a memory block BLKb according to an embodiment, respectively.
Figure 4:
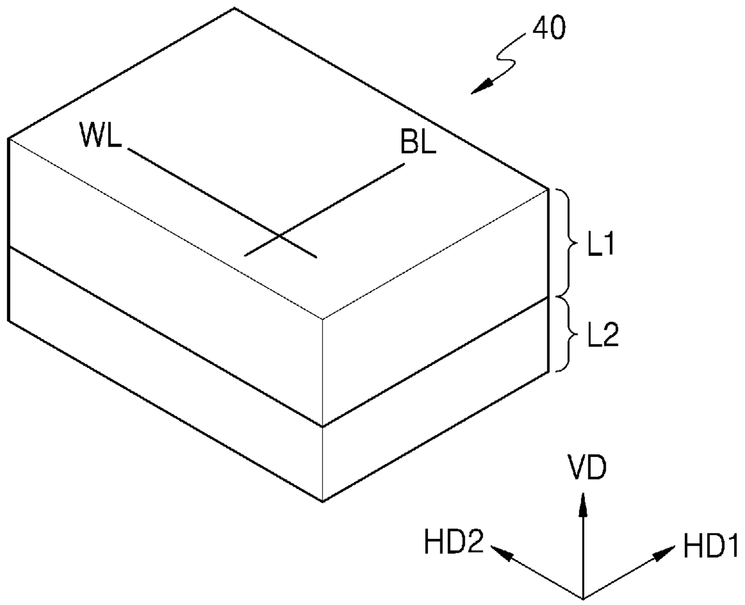
FIG. 4 schematically shows a memory device having a cell over peri (COP) structure, according to an embodiment.
Figure 5:
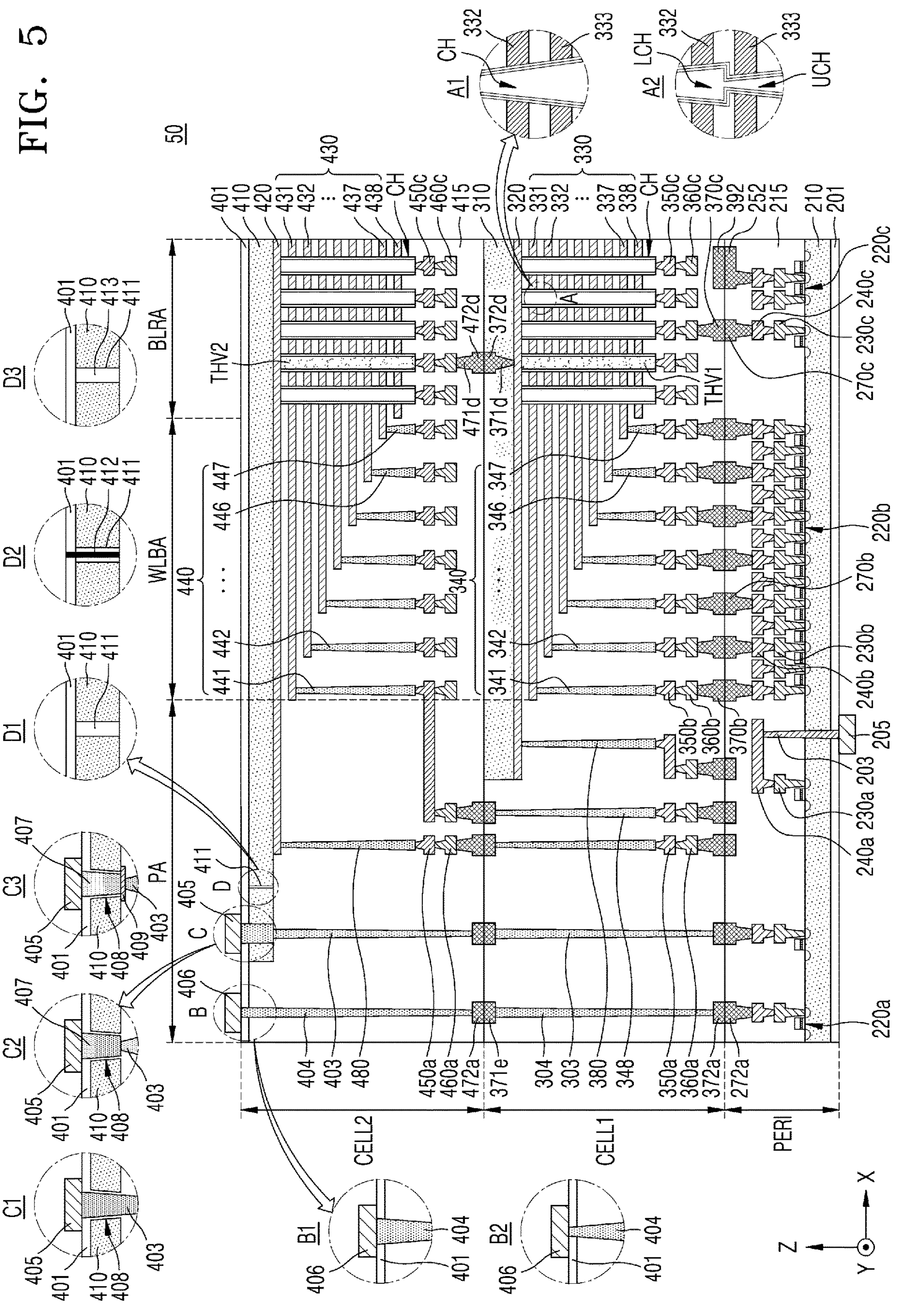
FIG. 5 is a cross-sectional view of a memory device having a bonding vertical NAND (B-VNAND) structure, according to an embodiment.

According to an embodiment, the first memory cell array 11*a* and the second memory cell array 11*b* may be arranged in a first semiconductor layer (e.g., L2 of FIG. 4 or CELL1 and CELL2 of FIG. 5), and the peripheral circuit PECT. may be disposed in a second semiconductor layer (e.g., L2 of FIG. 4 or PERI of FIG. 5). A region in which the peripheral circuit PECT is disposed may have overlapping boundaries of the first memory cell array 11*a* and the second memory cell array 11*b* in a vertical direction (ex. when viewed from the vertical direction VD of FIG. 3A, or from a plan view).

Figure 2:
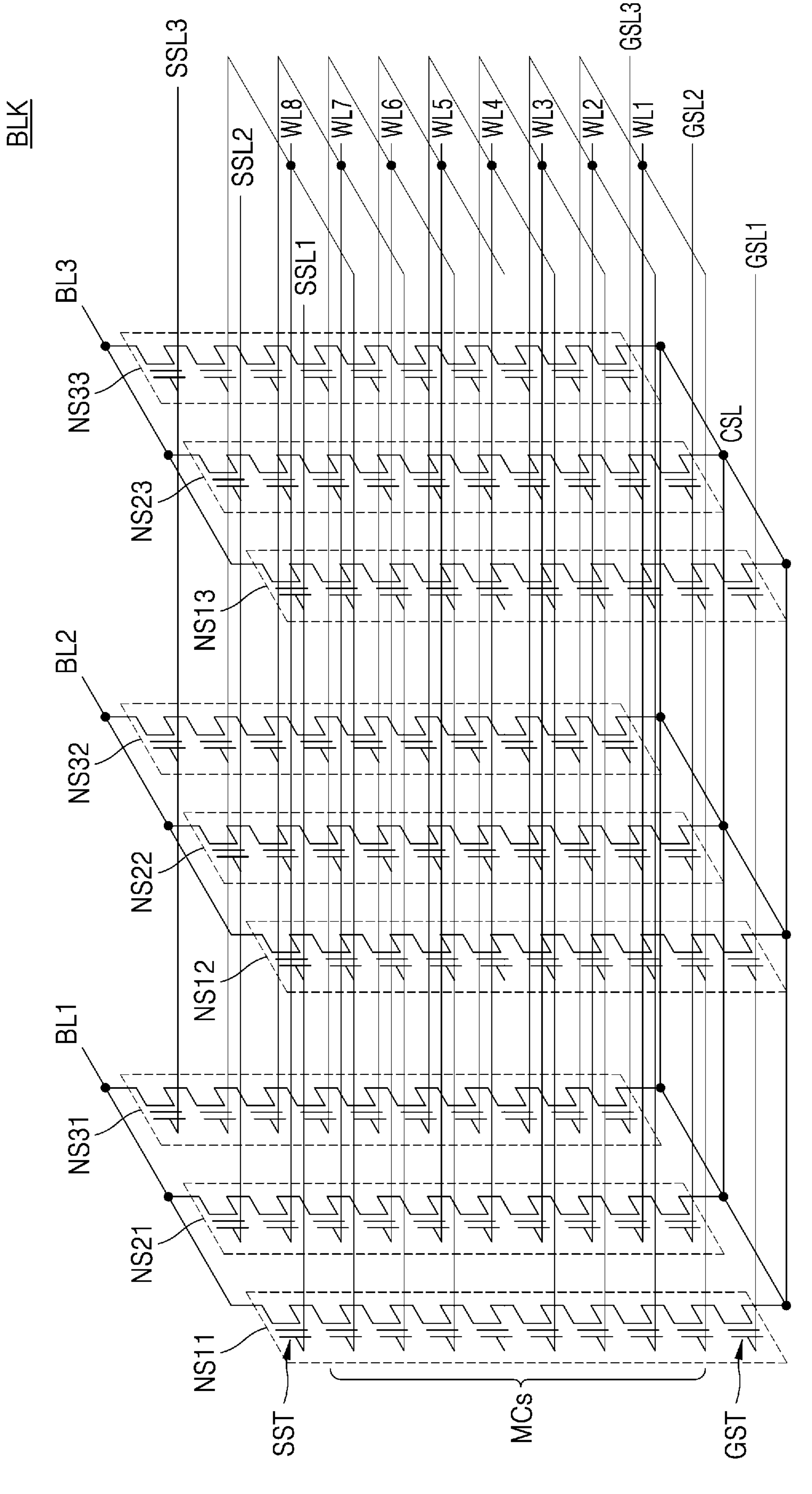
FIG. 2 is a circuit diagram showing a memory block BLK according to an embodiment.

FIG. 2 is a circuit diagram showing a memory block BLK according to an embodiment.

Referring to FIG. 2, the memory block BLK may correspond to one of the plurality of memory blocks BLK11 to BLK1*z* and the plurality of memory blocks BLK21 to BLK2*z* of FIG. 1. The memory block BLK may include NAND strings NS11 to NS33, and each NAND string (e.g., NS11) may include a string select transistor SST, a plurality of memory cells MCs, and a ground select transistor GST connected in series. The string select transistor SST, the ground select transistor GST, and the memory cells MCs included in each NAND string may form a stacked structure on a substrate in a vertical direction.

Bit lines BL1 to BL3 may extend in a first direction or a first horizontal direction, and word lines WL1 to WL8 may extend in a second direction or a second horizontal direction. In this specification, the first horizontal direction indicates the first direction, and the second horizontal direction indicates the second direction. NAND cell strings NS11, NS21, and NS31 may be provided between a first bit line BL1 and a common source line CSL, NAND cell strings NS12, NS22, and NS32 may be provided between a second bit line BL2 and the common source line CSL, and NAND cell strings NS13, NS23, and NS33 may be provided between a third bit line BL3 and the common source line CSL.

The string select transistor SST may be coupled to corresponding string select lines SSL1 to SSL3. The memory cells MCs may be respectively connected to corresponding word lines WL1 to WL8. The ground select transistor GST may be coupled to corresponding ground select lines GSL1 to GSL3. The string select transistors SST may be respectively connected to a corresponding bit line BL, and the ground select transistor GST may be connected to the common source line CSL. Here, the number of NAND strings, the number of word lines, the number of bit lines, the number of ground select lines, and the number of string select lines may vary according to embodiments.

Figure 3B:
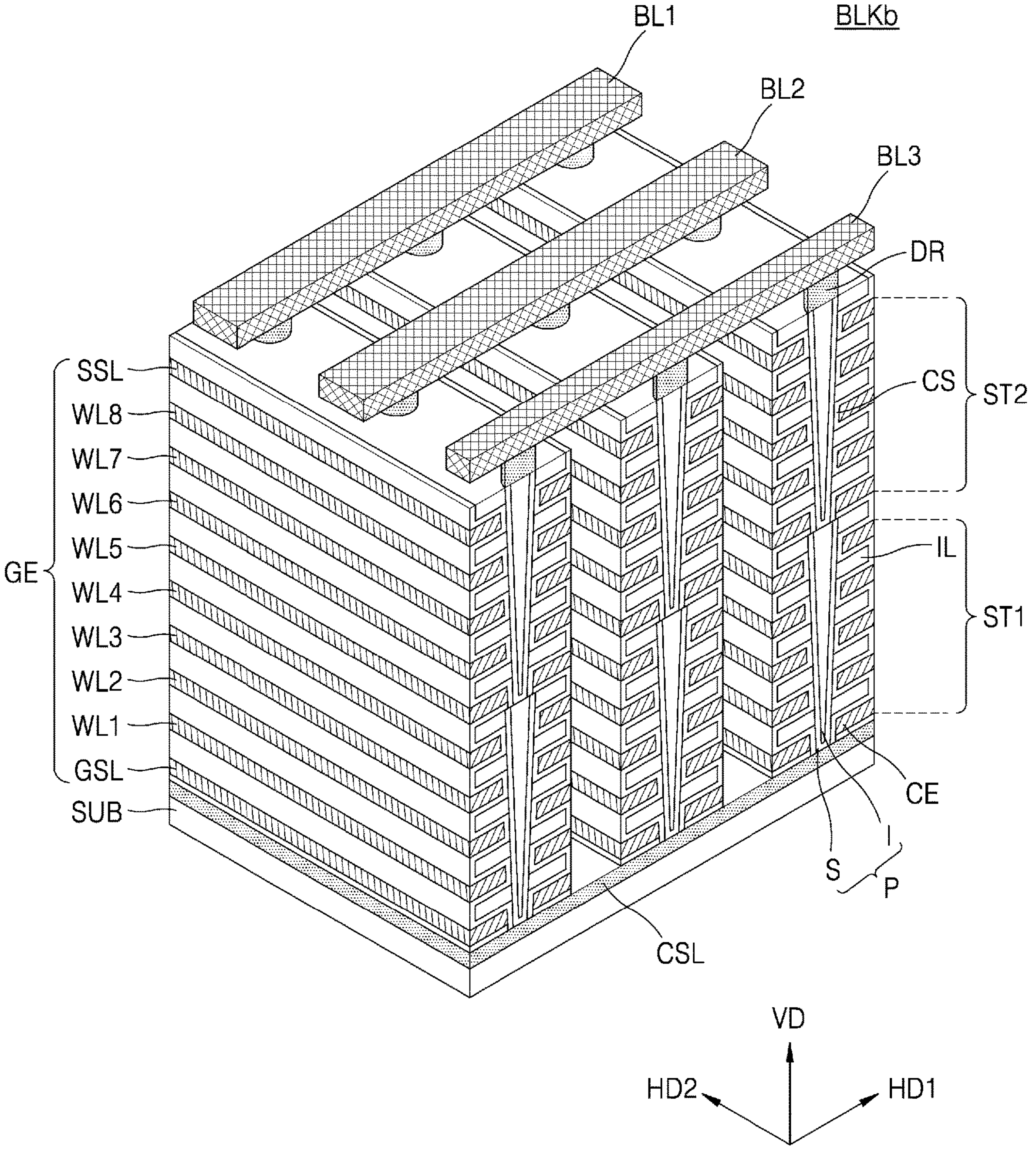

FIGS. 3A and 3B are perspective views of a memory block BLKa and a memory block BLKb according to an embodiment, respectively.

Referring to FIG. 3A, a memory block BLKa may correspond to one of the plurality of memory blocks BLK11 to BLK1*z* and the plurality of memory blocks BLK21 to BLK2*z* of FIG. 1. The memory block BLKa is formed in a vertical direction VD with respect to a substrate SUB. The substrate SUB has a first conductivity type (e.g., p-type) and extends in the second direction or a second horizontal direction HD2 on the substrate SUB. According to an embodiment, the common source line CSL may be provided to the substrate SUB by being doped with impurities of a second conductivity type (e.g., n-type). According to another embodiment, the common source line CSL may be implemented as a conductive layer like a metal layer. A plurality of insulation layers IL extending in the second horizontal direction HD2 are sequentially provided in a vertical direction VD on the substrate SUB between two adjacent common source lines CSL, and the insulation layers IL are a certain distance apart from each other in the vertical direction VD. For example, the insulation layers IL may include or be formed of an insulating material like silicon oxide.

A plurality of pillars P, which are sequentially arranged in the first direction or a first horizontal direction HD1 and penetrate through the insulation films IL in the vertical direction VD, are provided on the substrate SUB between two adjacent common source lines CSL. For example, in one embodiments, the pillars P contact the substrate SUB or contact the common source line CSL by penetrating through the insulation layers IL. In detail, a surface layer S of each pillar P may include or be formed of a silicon-based material doped with impurities of the first conductivity type and function as a channel region. Therefore, according to some embodiments, a pillar P may be referred to as a channel structure or a vertical channel structure. On the other hand, an internal layer I of each pillar P may include or be formed of an insulating material, such as silicon oxide or an air gap.

A charge storage layer CS is provided along exposed surfaces of the insulation layers IL, the pillars P, and the substrate SUB in the region between the two adjacent common source lines CSL. The charge storage layer CS may include a gate insulation layer (also referred to as a 'tunneling insulation layer'), a charge trapping layer, and a blocking insulation layer. For example, the charge storage layer CS may have an oxide-nitride-oxide (ONO) structure. Also, gate electrodes GE like selected gate lines GSL and SSL and word lines WL1 through WL8 are provided on an exposed surface of the charge storage layer CS in the region between the two adjacent common source lines CSL. Drain contacts or drains DR are provided on the pillars P, respectively. For example, the drains DR may include or be formed of a silicon-based material doped with impurities of the second conductivity type. The bit lines BL1 to BL3 extending in the first horizontal direction HD1 and being a certain distance apart from one another in the second horizontal direction HD2 may be provided on the drain contacts DR. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the verb "contact"), there are no intervening elements present at the point of contact.

Referring to FIG. 3B, a memory block BLKb may correspond to one of the plurality of memory blocks BLK11 to BLK1*z* and the plurality of memory blocks BLK21 to BLK2*z* of FIG. 1. Also, the memory block BLKb corresponds to a modified example of the memory block BLKa of FIG. 3A, and the descriptions given above with reference to FIG. 3A may also be applied to the embodiment of FIG. 3B. The memory block BLKb is formed in the vertical direction VD with respect to the substrate SUB. The memory block BLKb may include a first memory stack ST1 and a second memory stack ST2 stacked in the vertical direction VD.

FIG. 4 schematically shows a memory device 40 having a cell over peri (COP) structure, according to an embodiment.

Referring to FIGS. 1 and 4 together, the memory device 40 may include a first semiconductor layer L1 and a second semiconductor layer L2, and the first semiconductor layer L1 may be stacked in the vertical direction VD with respect to the second semiconductor layer L2. In detail, the second semiconductor layer L2 may be disposed below the first semiconductor layer L1 in the third direction D3, and thus, the second semiconductor layer L2 may be disposed closer to a package substrate than the first semiconductor layer L1. The first semiconductor layer L1 may include conductive layers, insulative material, and semiconductor structures that together form a memory cell array 11, and the second semiconductor layer L2 may include conductive layers, insulative materials, and semiconductor structures the together form a logic circuit.

According to an embodiment, the memory cell array 11 may be formed in the first semiconductor layer L1, and the peripheral circuit PECT may be formed in the second semiconductor layer L2. Therefore, the memory device 40 may have a structure in which the memory cell array 11 is disposed above the peripheral circuit PECT, that is, the COP structure. The COP structure may effectively reduce a horizontal area and improve the degree of integration of the memory device 40.

According to an embodiment, the second semiconductor layer L2 may include a substrate, and the peripheral circuit PECT may be formed in the second semiconductor layer L2 by forming transistors and metal patterns for wiring the transistors in and on the substrate. After the peripheral circuit PECT is formed in the second semiconductor layer L2, the first semiconductor layer L1 including the first memory cell array 11*a* and the second memory cell array 11*b* may be formed, and metal patterns for electrically connecting the word lines WL and the bit lines BL of the first memory cell array 11*a* and the second memory cell array 11*b* to the peripheral circuit PECT formed in the second semiconductor layer L2 may be formed. For example, the bit lines BL may extend in the first horizontal direction HD1, and the word lines WL may extend in the second direction HD2. For example, the memory block BLKa of FIG. 3A or the memory block BLKb of FIG. 3B may be formed in the first semiconductor layer L1.

Along with the development of semiconductor processes, as the number of stacks of memory cells arranged in the first memory cell array 11*a* and the second memory cell array 11*b* of the first semiconductor layer L1 increases (i.e., the number of stacks of the word lines WL increases), areas of the first memory cell array 11*a* and the second memory cell array 11*b*, that is, the area of a cell region have decreased. For example, the cell region may be defined as a region in which a plurality of NAND strings (e.g., NS11 to NS33 of FIG. 2) or a plurality of pillars (e.g., P of FIGS. 3A and 3B) are arranged. For example, the cell region may be defined as a region in which a plurality of word lines (e.g., WL1 to WL8 of FIGS. 2, 3A, and 3B) are arranged. For example, the cell region may be defined as a region in which a plurality of bit lines (e.g., BL1, BL2, BL3 of FIGS. 2, 3A, and 3B) are arranged. However, the definition of the cell region is not limited thereto, and the cell region may be defined as a region including the first memory cell array 11*a* and the second memory cell array 11*b*.

Meanwhile, the area of a peripheral circuit region in which the peripheral circuit PECT of the second semiconductor layer L2 is disposed may not decrease as much as the area of the cell region does. According to an embodiment, the first memory cell array 11*a* and the second memory cell array 11*b* may share a peripheral circuit (e.g., the page buffer circuit 12 of FIG. 1), and so peripheral circuits respectively corresponding to the first memory cell array 11*a* and the second memory cell array 11*b* may not be needed. Therefore, the area occupied by the peripheral circuit region may decrease.

FIG. 5 is a view illustrating a memory device 50 according to some embodiments of the inventive concepts.

Referring to FIG. 5, the memory device 50 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern (e.g., metal pad layer) formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W). The various metal layers described herein as being bonding metal patterns may be metal pad layers, including pads for communicating signals and/or voltage between semiconductor device components, which are bonded to metal layers or to other metal pad layers. Also, it should be noted that terms such as “upper” and “lower” as used in certain embodiments with respect to chips refers to a “top” of the chip with respect to a chip substrate being located at a bottom of the chip and having wiring and other patterns being formed above the substrate. So a chip may be oriented upside down in a drawing, and portions of this specification may describe the bottom of chip as shown in the drawing as the portion including an “uppermost metal layer” of the chip. Therefore, unless noted otherwise, an “uppermost metal layer” of a chip is a metal layer furthest from a substrate of the chip in a vertical direction, and a “lowermost metal layer” is a metal layer formed at the same surface of the chip as the chip substrate.

The memory device 50 may include the at least one upper chip including the cell region. For example, as illustrated in FIG. 5, the memory device 50 may include two upper chips. However, the number of the upper chips is not limited thereto. In the case in which the memory device 50 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 50. The first upper chip may be turned over and then may be connected to the lower chip by the bonding method, and the second upper chip may also be turned over and then may be connected to the first upper chip by the bonding method. As mentioned above, hereinafter, upper and lower portions of each of the first and second upper chips, and upper and lower (or top and bottom) portions of components of the first and second upper chips will be defined based on before each of the first and second upper chips is turned over. In other words, an upper portion of the lower chip may mean an upper portion defined based on a +Z-axis direction (higher upward in the drawing sheet), and the upper portion of each of the first and second upper chips may mean an upper portion defined based on a −Z-axis direction (lower downward in the drawing sheet) in FIG. 5. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 50 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the present embodiments. However, embodiments of the inventive concepts are not limited thereto. In certain embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*. The first metal lines and second metal lines (and other "lines" described herein) may primarily extend in a horizontal direction.

The interlayer insulating layer 215 may be disposed on the first substrate 210 and may include or be formed of an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310. Sidewalls of the channel structure CH may be tapered in the manner depicted in region 'A1'.

In some embodiments, as illustrated in a region 'A2', the channel structure CH may include a lower channel LCH and an upper channel UCH, which are connected to each other. Region 'A2' is an alternative for region 'A1'. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 50 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

In some embodiments, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 5, the first through-electrode THV1 may penetrate the common source line 320 and the plurality of word lines 330. In certain embodiments, the first through-electrode THV1 may further penetrate the second substrate 310. The first through-electrode THV1 may include or be formed of a conductive material. Alternatively, the first through-electrode THV1 may include or be formed of a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end (e.g., bottom surface) of the first upper chip including the first cell region CELL1, and the second through-metal pattern 472*d* may be formed at a top end (e.g., top surface) of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 5, in the word line bonding region WLBA, the word lines 330 of the first cell region CELL1 may extend (e.g., lengthwise) in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. The first metal lines 350*b* and second metal lines 360*b* may extend horizontally. The various metal lines described herein, where depicted in the drawings, may be connected to other metal lines or other components (e.g., plugs) through conductive vias or contacts, e.g., extending vertically between metal lines or other components. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected (and physically connected) to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 5, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. For example, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. For example, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

In some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410, and may extend the entire length in the Y-direction, or may extend a partial length in the Y-direction, of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

In certain embodiments, the first to third input/output pads 205, 405 and 406 may be selectively formed. For example, the memory device 50 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed. Note that the different pads, plugs, lines, etc., depicted in FIG. 5 and/or described in the specification in the singular, are provided in plural, as the figures only show a portion of the memory device and only show a cross-section along the X-Z plane.

Referring to FIGS. 1 and 5 together, along with the development of semiconductor processes, as the number of stacks of memory cells arranged in the first memory cell array 11*a* and the second memory cell array 11*b* of the first cell region CELL1 and the second cell region CELL2 have increased (i.e., the number of stacks of the word lines WL increases), areas of the first memory cell array 11*a* and the second memory cell array 11*b*, that is, the area of a cell region has decreased. For example, the cell region may be defined as a region in which a plurality of NAND strings (e.g., NS11 to NS33 of FIG. 2) or a plurality of pillars (e.g., P of FIGS. 3A and 3B) are arranged. For example, the cell region may be defined as a region in which a plurality of word lines (e.g., WL1 to WL8 of FIGS. 2, 3A, and 3B) are arranged. For example, the cell region may be defined as a region in which a plurality of bit lines (e.g., BL1, BL2, BL3 of FIGS. 2, 3A, and 3B) are arranged. However, the definition of the cell region is not limited thereto, and the cell region may be defined as a region including the first memory cell array 11*a* and the second memory cell array 11*b*.

According to an embodiment, to reduce the area of the peripheral circuit region PERI, an operation may be performed on the first memory cell array 11*a* and the second memory cell array 11*b* by using one peripheral circuit. For example, since the first memory cell array 11*a* and the second memory cell array 11*b* may share the peripheral circuit, the area of the peripheral circuit region PERI may be decreased.

Figure 6:
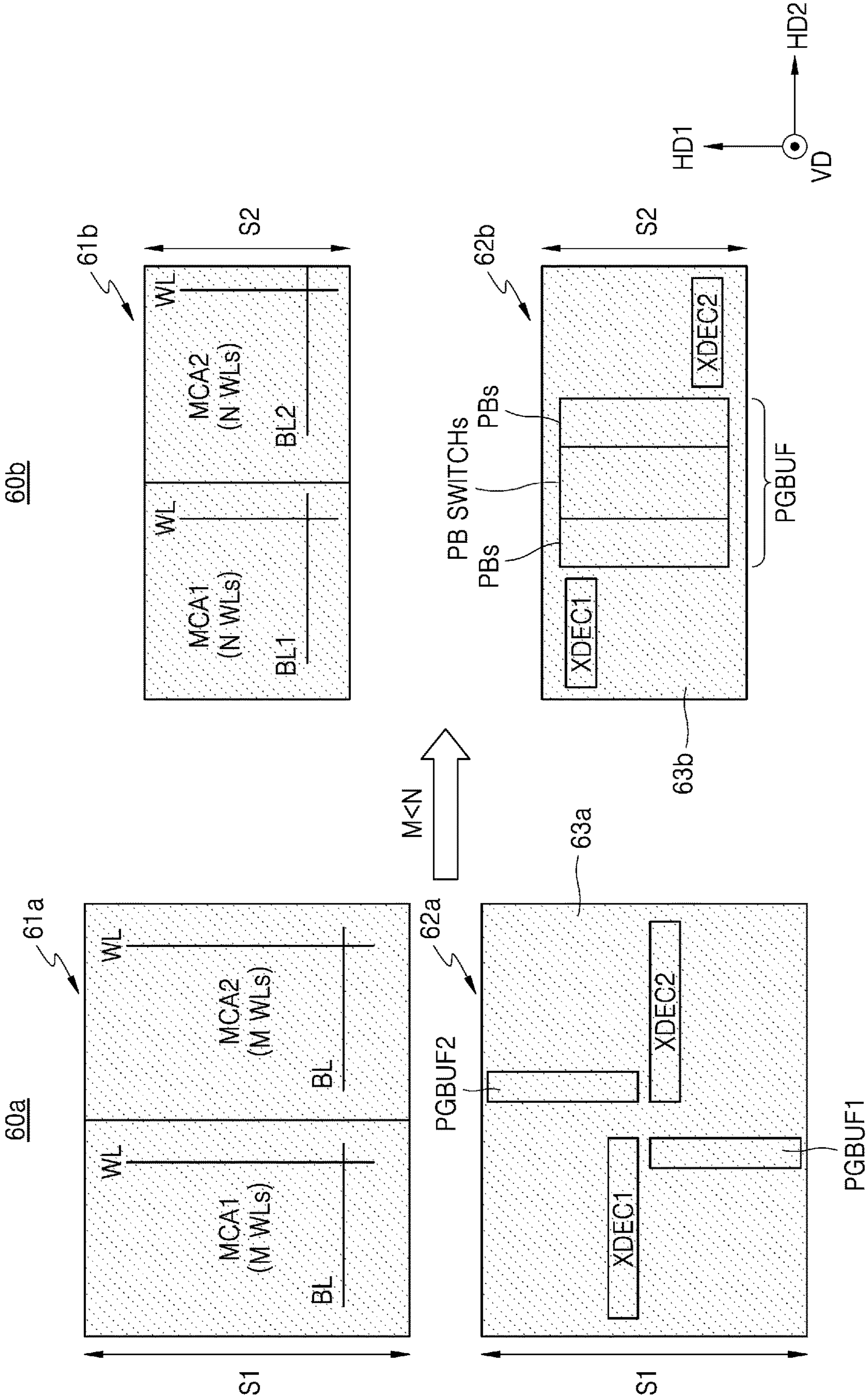
FIG. 6 shows a memory device according to a comparative example and a memory device according to an embodiment.

FIG. 6 shows a memory device 60*a* according to a comparative example and a memory device 60*b* according to an embodiment.

Referring to FIG. 6, the memory device 60*a* according to the comparative example may include a first semiconductor layer 61*a* on which a first memory cell array MCA1 and a second memory cell array MCA2 are arranged and a second semiconductor layer 62*a* on which page buffer circuits PGBUF1 and PGBUF2 and a first row decoder XDEC1 and a second row decoder XDEC2 are arranged. When the first memory cell array MCA1 and the second memory cell array MCA2 each include M word lines stacked in a vertical direction (i.e., a stack structure of M word lines), the first memory cell array MCA1 and the second memory cell array MCA2 may have a first size S1 in the first horizontal direction HD1 (M is a natural number equal to or greater than 2). Also, the second semiconductor layer 62*a* may also have the first size S1 in the first horizontal direction HD1, and thus the first memory cell array MCA1 and the second memory cell array MCA2 may overlap the upper portion of the second semiconductor layer 62*a*. In this case, the area of an overlapping region 63*a* on the second semiconductor layer 62*a* may correspond to the area of the first memory cell array MCA1 and the second memory cell array MCA2. In other words, the size of the overlapping region 63*a* on the second semiconductor layer 62*a* in the first horizontal direction HD1 may correspond to the first size S1, which is identical to the size of the first memory cell array MCA1 and the second memory cell array MCA2 in the first horizontal direction HD1.

The memory device 60*b* according to an embodiment may include a first semiconductor layer 61*b* on which the first memory cell array MCA1 and the second memory cell array MCA2 are arranged and a second semiconductor layer 62*b* on which the page buffer circuit PGBUF, the first row decoder XDEC1 and the second row decoder XDEC2 are arranged. According to the development of semiconductor processing technology, the number of word lines stacked in the vertical direction may increase from M to N (N is a natural number greater than M). Therefore, when the first memory cell array MCA1 and the second memory cell array MCA2 include N word lines stacked in the vertical direction (i.e., when the first memory cell array MCA1 and the second memory cell array MCA2 include a stacked structure of N word lines), the areas of the first memory cell array MCA1 and the second memory cell array MCA2 may decrease. For example, the areas of the first memory cell array MCA1 and the second memory cell array MCA2 may decrease by 60% as compared to the comparative example.

In more detail, the first memory cell array MCA1 and the second memory cell array MCA2 may have a second size S2 smaller than the first size S1 in the first horizontal direction HD1.

According to an embodiment, since the first memory cell array MCA1 and the second memory cell array MCA2 share the page buffer circuit PGBUF, unlike the second semiconductor layer 62*a*, the second semiconductor layer 62*b* may include one page buffer circuit PGBUF. Therefore, since the area of the peripheral circuit region PERI decreases, the second semiconductor layer 62*b* may have the second size S2 in the first horizontal direction HD1, and the first memory cell array MCA1 and the second memory cell array MCA2 may overlap the upper portion of the second semiconductor layer 62*b*. In this case, the area of an overlapping region 63*b* on the second semiconductor layer 62*b* may correspond to the area of the first memory cell array MCA1 and the second memory cell array MCA2.

According to an embodiment, since the area of the second semiconductor layer 62*b* decreases simultaneously as the area of the first semiconductor layer 61*b* decreases, the area of the memory device 60*b* in the horizontal direction may also decrease.

Referring to FIG. 6, the page buffer circuit PGBUF may include a plurality of page buffers PBs. The plurality of page buffers PBs may each sense data from a memory cell or provide data to a memory cell through a connected bit line. Some of the plurality of page buffers PBs may be arranged in a region overlapping a first memory cell array MCA1, and the remaining of the plurality of page buffers PBs may be arranged in a region overlapping a second memory cell array MCA2. The plurality of page buffers PBs may each be connected to a bit line BL1 of the first memory cell array MCA1 and a bit line BL2 of the second memory cell array MCA2. In detail, the plurality of page buffers PBs may each be selectively connected to the bit line BL1 and the bit line BL2 through page buffer switches PB SWITCHs. For example, each page buffer of the plurality of page buffers PBs may be selectively connected to a corresponding bit line BL1 and a corresponding bit line BL2, and may selectively communicate through the corresponding bit line BL1 and/or the corresponding bit line BL2 according to a page buffer switch. Therefore, the bit lines BL1 and the bit lines BL2 may share the plurality of page buffers PB through the page buffer switches PB SWITCHs.

Figure 7A:
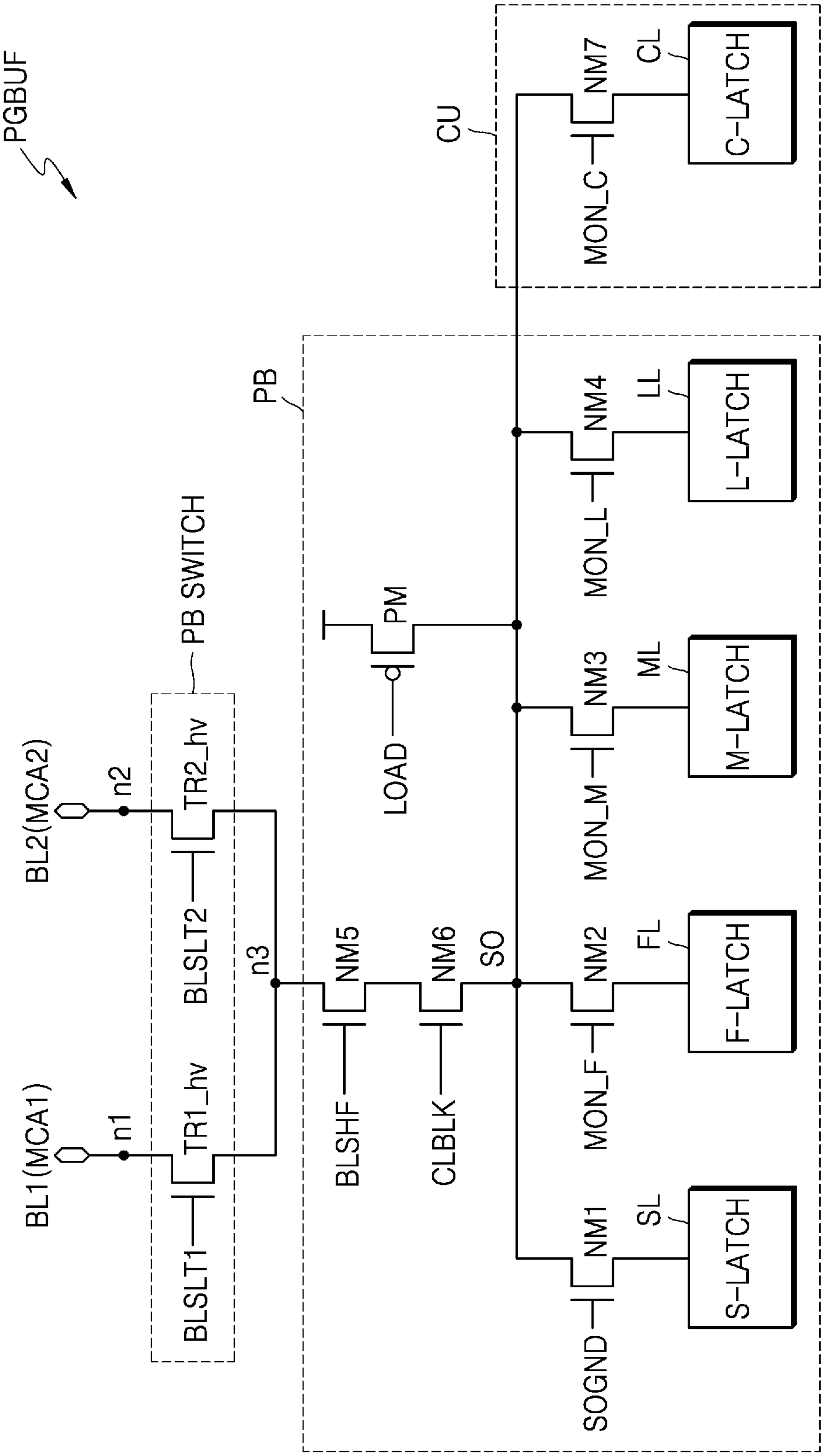
FIGS. 7A to 7C are circuit diagrams showing a page buffer circuit according to an embodiment.
Figure 7B:
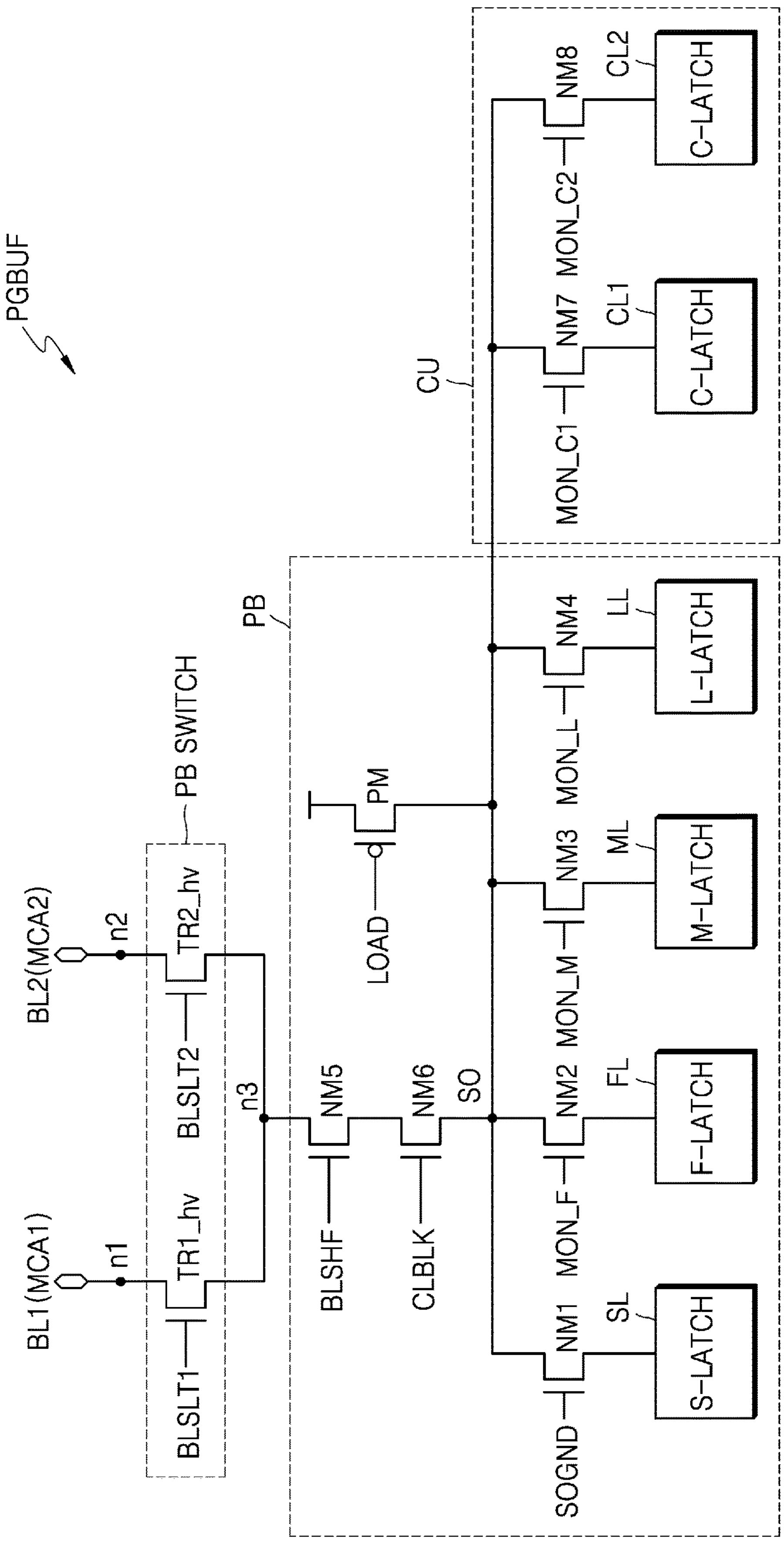
Figure 7C:
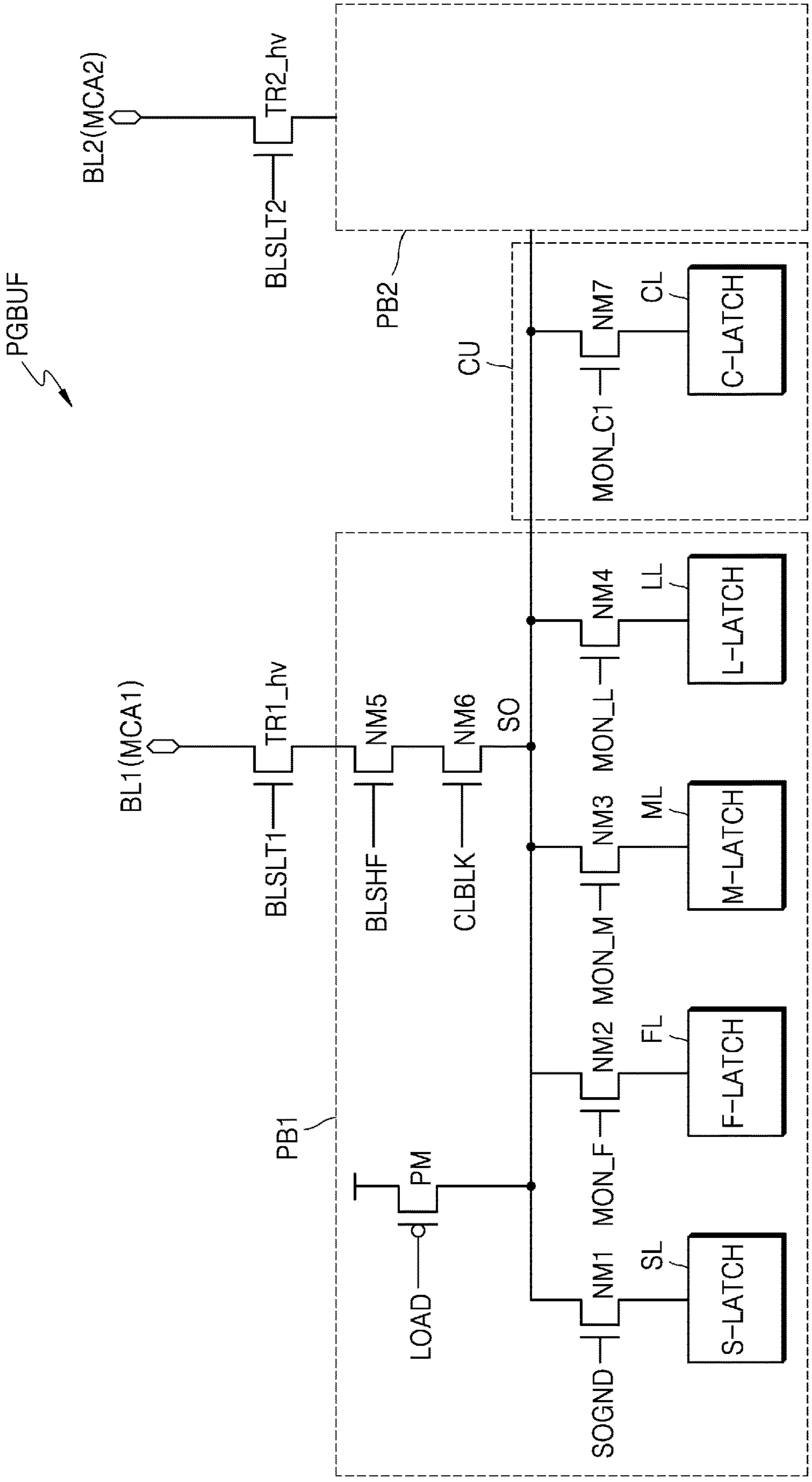

FIGS. 7A to 7C are circuit diagrams showing the page buffer circuit PGBUF according to an embodiment.

Referring to FIG. 7A, the page buffer circuit PGBUF may correspond to each of the plurality of page buffers PB1 to PBn of FIG. 1 and may also correspond to the page buffer circuit PGBUF of FIG. 6. The page buffer circuit PGBUF may include a page buffer switch PB SWITCH, a page buffer PB, and a cache unit CU, and the cache unit CU may include a cache latch CL (C-LATCH).

The page buffer switch PB SWITCH, also described as a page buffer switch circuit, may include a first bit line select transistor TR1_*hv* (e.g., a first switch) and a second bit line select transistor TR2_*hv* (e.g., a second switch). The first bit line select transistor TR1_*hv* may be connected to the first bit line BL1 of the first memory cell array MCA1 and may be driven by a first bit line select signal BLSLT1. The first bit line select transistor TR1_*hv* may be connected to the first bit line BL1 through a first node n1, and may be connected to the page buffer PB through a third node n3. The second bit line select transistor TR2_*hv* may be connected to the second bit line BL2 of the second memory cell array MCA2 and may be driven by a second bit line select signal BLSLT2. The second bit line select transistor TR2_*hv* may be connected to the second bit line BL2 through a second node n2 and may be connected to the page buffer PB through the third node n3.

The first bit line select transistors TR1_*hv* and the second bit line select transistor TR2_*hv* may be implemented as "high voltage transistors" and may be arranged in a well region different from the page buffer PB. According to some embodiments, the first bit line select transistor TR_hv1 and the second bit line select transistor TR_hv2 may be referred to as bit line select switches or high voltage switches.

The page buffer PB may include a sensing latch SL (S-LATCH), a force latch FL (F-LATCH), an upper bit latch or most-significant-bit latch ML (M-LATCH), and a lower bit latch or a least-significant-bit latch LL (L-LATCH). According to some embodiments, the sensing latch SL, the force latch FL, the more-significant-bit latch ML, or the less-significant-bit latch LL may be referred to as a "main latch". Although not shown, the page buffer PB may further include a pre-charge circuit capable of controlling a pre-charge operation for the bit line BL or a sensing node SO based on a bit line clamping control signal and may further include a transistor driven by a bit line setup signal.

The sensing latch SL may store data stored in a memory cell or a result of sensing a threshold voltage of a memory cell during a read operation or a program verification operation. Also, the sensing latch SL may be used to apply a program bit line voltage or a program inhibit voltage to the bit line BL during a program operation. The force latch FL may be used to store force data and improve threshold voltage distribution during a program operation. The force data may be initially set to '1' and then inverted to '0' when the threshold voltage of a memory cell enters a forcing region that is less than a target region. The more-significant-bit latch ML, the less-significant-bit latch LL, and the cache latch CL may be used to store data input from the outside during a program operation. The cache latch CL may receive data read from a memory cell during a read operation from the sensing latch SL and output the data to the outside through a data input/output line.

The page buffer PB may further include first to fourth transistors NM1 to NM4. A first transistor NM1 may be connected between the sensing node SO and the sensing latch SL and may be driven by a ground control signal SOGND. A second transistor NM2 may be connected between the sensing node SO and the force latch FL and may be driven by a forcing monitoring signal MON_F. A third transistor NM3 may be connected between the sensing node SO and the more-significant-bit latch ML and may be driven by a more-significant-bit monitoring signal MON_M. A fourth transistor NM4 may be connected between the sensing node SO and the less-significant-bit latch LL and may be driven by a less-significant-bit monitoring signal MON_L.

The page buffer PB may further include a fifth transistor NM5 and a sixth transistor NM6 connected in series between the bit line select transistors TR_hv and the sensing node SO. A fifth transistor NM5 may be driven by a bit line shut-off signal BLSHF, and a sixth transistor NM6 may be driven by a bit line connection control signal CLBLK. Also, the page buffer PB may further include a pre-charge transistor PM. The pre-charge transistor PM is connected to the sensing node SO, is driven by a load signal LOAD, and pre-charges the sensing node SO to a pre-charge level during a pre-charge period.

The cache unit CU may include the cache latch CL and a seventh transistor NM7. The seventh transistor NM7 may be connected between the sensing node SO and the cache latch CL and may be driven by a cache monitoring signal MON_C. The cache latch CL may be connected to a data input/output line, and thus the cache unit CU may be disposed adjacent to the data input/output line. As described above, the page buffer PB and the cache unit CU may be arranged to be spaced apart from each other, and thus the page buffer circuit PGBUF may have a structure in which the page buffer PB and the cache unit CU are separated from each other.

According to an embodiment, the first bit line BL1 and the second bit line BL2 of the first memory cell array MCA1 and the second memory cell array MCA2 may share the page buffer circuit PGBUF through the page buffer switch PB SWITCH. In detail, as the first bit line select transistor TR1_*hv* is turned on by the first bit line select signal BLSLT1, the first bit line BL1 of the first memory cell array MCA1 may be connected to the page buffer circuit PGBUF. Also, as the second bit line select transistor TR2_*hv* is turned on by the second bit line select signal BLSLT2, the second bit line BL2 of the second memory cell array MCA2 may be connected to the page buffer circuit PGBUF.

Referring to FIG. 7B, the cache unit CU may include a first cache latch CL1 and a second cache latch CL2. The seventh transistor NM7 connected to the first cache latch CL1 may be driven by a first cache monitoring signal MON_C1, and an eighth transistor NM8 connected to the second cache latch CL2 may be driven by a second cache monitoring signal MON_C2.

The first cache latch CL1 may be driven when an operation on the first memory cell array MCA1 is performed, and the second cache latch CL2 may be driven when an operation on the second memory cell array MCA2 is performed. For example, when data sensed by the first memory cell array MCA1 is transferred to the first cache latch CL1, data of the first cache latch CL1 may be output to the outside in a state where the seventh transistor NM7 is turned off. Therefore, since data to be stored in the second memory cell array MCA2 may be input through the second cache latch CL2 while the data of the first cache latch CL1 is being output to the outside, the input/output operation speed may be improved.

Referring to FIG. 7C, the first bit line BL1 of the first memory cell array MCA1 and the first page buffer PB1 may be connected to each other through the first bit line select transistor TR1_*hv*, and the second bit line BL2 of the second memory cell array MCA2 and the second page buffer PB2 may be connected to each other through the second bit line select transistor TR2_*hv*.

The second page buffer PB2 may have the same structure as the first page buffer PB1.

The sensing node SO of the first page buffer PB1 and a sensing node of the second page buffer PB2 may be connected to the cache unit CU. Although not shown, a switching element for switching the connection between the first page buffer PB1 and the cache unit CU may be further included, and a switching element for switching the connection between the second page buffer PB2 and the cache unit CU may be further included. According to the embodiment of FIG. 7C, an operation on the first memory cell array MCA1 performed through the first page buffer PB1 and an operation on the second memory cell array MCA2 performed through the second page buffer PB2 may be performed simultaneously. For example, a first read operation on the first memory cell array MCA1 and a second read operation on the second memory cell array MCA2 may be separately and simultaneously performed, and a result of the first read operation and a result of the second read operation may be sequentially output through the cache latch CL. Since each of the first page buffer PB1 and the second page buffer PB2 does not require its own cache latch, the size of the page buffer circuit PGBUF may be reduced.

Figure 8:
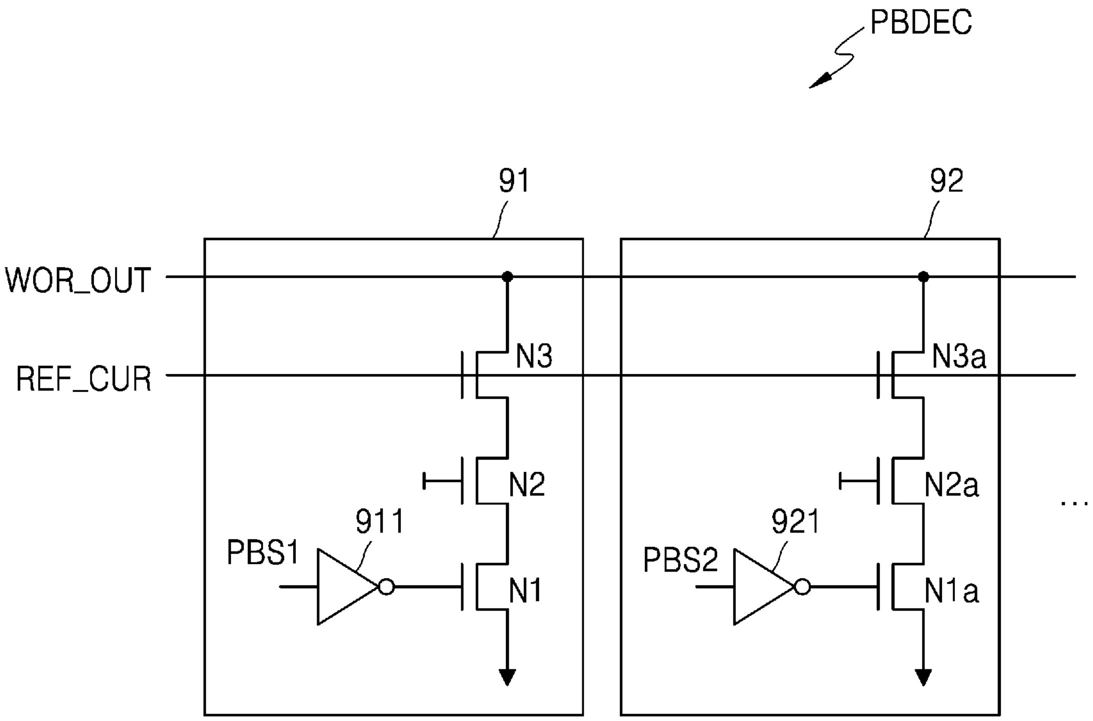
FIG. 8 is a circuit diagram showing a page buffer decoder according to an embodiment.

FIG. 8 is a circuit diagram showing a page buffer decoder PBDEC according to an embodiment.

Referring to FIG. 8, the page buffer decoder PBDEC may include a plurality of page buffer decoders for addressing and driving a memory cell array, e.g., a first page buffer decoder 91 and a second page buffer decoder 92. The first page buffer decoder 91 may include a first inverter 911 and transistors N1, N2, and N3. The first inverter 911 may receive a first page buffer signal PBS1 from a first page buffer circuit (e.g., PGBUF of FIG. 7), and an output of the first inverter 911 may be provided to a gate of a transistor N1. A source of the transistor N1 may be connected to a ground terminal, and a drain of the transistor N1 may be connected to a transistor N2. Transistors N2 and N3 are connected in series, and a reference current signal REF_CUR is applied to a gate of a transistor N3. The second page buffer decoder 92 may include a second inverter 921 and transistors N1*a*, N2*a*, and N3*a* and may receive a second page buffer signal PBS2 from a second page buffer circuit. The descriptions of the first page buffer decoder 91 may be applied to the second page buffer decoder 92, and descriptions identical to those already given above will be omitted.

Referring to FIGS. 7 and 8 together, for example, when a memory cell connected to the page buffer circuit PGBUF is program-failed, a logic low value may be stored in the sensing latch SL of the page buffer PB. In this case, the first page buffer signal PBS1 may be logic low, which corresponds to the voltage level of the sensing node SO. In this case, the first inverter 911 may output a logic high signal, and thus the transistor N1 may be turned on and the first page buffer decoder 91 may operate as a current sink. The transistor N3 may output a first signal, that is, a reference current, to a wired OR terminal WOR_OUT based on the reference current signal REF_CUR. Here, the reference current may correspond to a current flowing through the transistor N3 when the transistor N3 is turned on according to the reference current signal REF_CUR.

For example, the page buffer circuit 12 of FIG. 1 and the page buffer circuit PGBUF of FIG. 6 may each include the page buffer circuit PGBUF of FIG. 7. For example, the page buffer circuit 12 of FIG. 1 and the page buffer circuit PGBUF of FIG. 6 may each include the page buffer circuit PGBUF of FIG. 7 and the page buffer decoder PBDEC of FIG. 8. Hereinafter, according to embodiments, it may be described that the page buffer decoder PBDEC is included in a page buffer circuit or it may be described that the page buffer decoder PBDEC is disposed outside a page buffer circuit.

Figure 9:
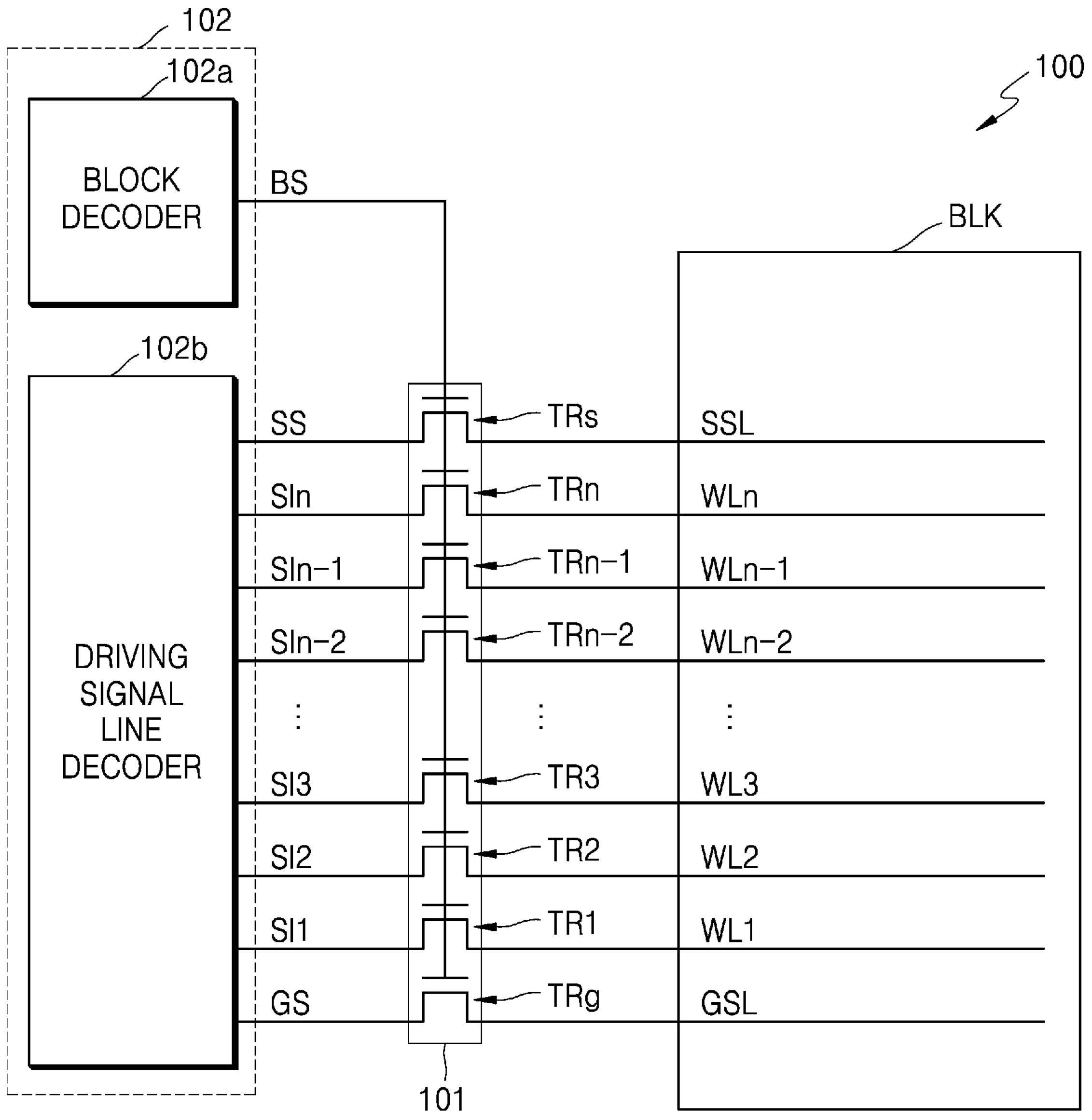
FIG. 9 shows a pass transistor circuit and a row decoder according to an embodiment.

FIG. 9 shows a pass transistor circuit 101 and a row decoder 102 according to an embodiment.

Referring to FIG. 9, a memory device 100 may include a memory block BLK, the pass transistor circuit 101, and the row decoder 102. The row decoder 102 may include a block decoder 102*a* and a driving signal line decoder 102*b*. For example, the row decoder 13 of FIG. 1 and the row decoders XDEC1 and XDEC2 of FIGS. 6, 10, 15A, 16A, 16B, and 16C may each include the row decoder 102. For example, the row decoder 13 of FIG. 1 and the row decoders XDEC1 and XDEC2 of FIGS. 6, 10, 15A, 16A, 16B, and 16C may each include the pass transistor circuit 101 and the row decoder 102.

The pass transistor circuit 101 may include a plurality of pass transistors TRg, TR1 to TRn, and TRs. The block decoder 102*a* may be connected to the pass transistor circuit 101 through a block select signal line BS. The block select signal line BS may be connected to gates of the plurality of pass transistors TRg, TR1 to TRn, and TRs. For example, when a block select signal provided through the block select signal line BS is activated, the plurality of pass transistors TRg, TR1 to TRn, and TRs are turned on, and thus the memory block BLK may be selected.

The driving signal line decoder 102*b* may be connected to the pass transistor circuit 101 through a ground select line driving signal line GS, word line driving signal lines SI1 to SIn, and a string select line driving signal line SS. In detail, the ground select line driving signal line GS, the word line driving signal lines SI1 to SIn, and the string select line driving signal line SS may be connected to sources of the plurality of pass transistors TRg, TR1 to TRn, and TRs, respectively.

The pass transistor circuit 101 may be connected to the memory block BLK through a ground select line GSL, word lines WL1 to WLn, and a string select line SSL. A pass transistor TRg may be connected between the ground select line driving signal line GS and the ground select line GSL. A plurality of pass transistors TR1 to TRn may be respectively connected between the word line driving signal lines SI1 to SIn and the plurality of word lines WL1 to WLn. A pass transistor TRs may be connected between the string select line driving signal line SS and the string select line SSL. For example, when a block select signal is activated, the plurality of pass transistors TRg, TR1 to TRn, and TRs may provide driving signals provided through the ground select line driving signal line GS, the word line driving signal lines SI1 to SIn, and the string select line driving signal line SS to the ground select line GSL, the word lines WL1 to WLn, and the string select line SSL, respectively.

Figure 10:
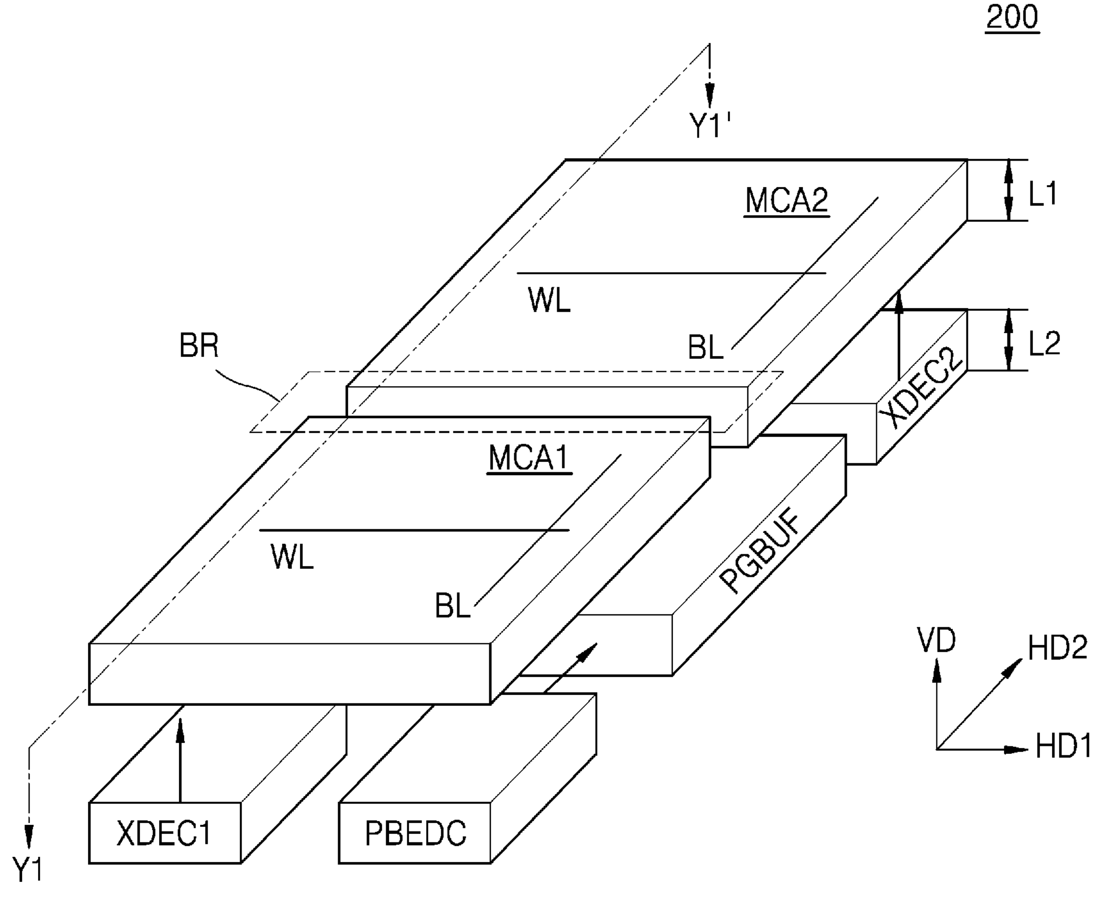
FIG. 10 is a perspective view of a memory device according to an embodiment.

FIG. 10 is a perspective view of a memory device according to an embodiment.

Referring to FIG. 10, a memory device 200 may include the first memory cell array MCA1, the second memory cell array MCA2, a first row decoder XDEC1, a second row decoder XDEC2, the page buffer decoder PBDEC, and the page buffer circuit PGBUF.

The first memory cell array MCA1 and the second memory cell array MCA2 may be arranged adjacent to each other in the second horizontal direction HD2 and may be included in the first semiconductor layer L1 (as also depicted in FIGS. 4 and 5).

The first row decoder XDEC1, the second row decoder XDEC2, the page buffer decoder PBDEC, and the page buffer circuit PGBUF may be included in the second semiconductor layer L2 (as also depicted in FIGS. 4 and 5).

Referring to FIG. 10, a boundary region BR may be formed between the first memory cell array MCA1 and the second memory cell array MCA2. The boundary region BR may be a region defined by a word line cut WL cut (e.g., a region where the word lines are cut and an insulative material is formed to separate word lines that were cut). A region in which the page buffer circuit PGBUF is disposed may overlap the boundary region BR in the vertical direction VD. For example, the page buffer switch PB switch, the page buffer PB, or the cache latch CL may overlap the boundary region BR in the vertical direction VD.

Figure 11A:
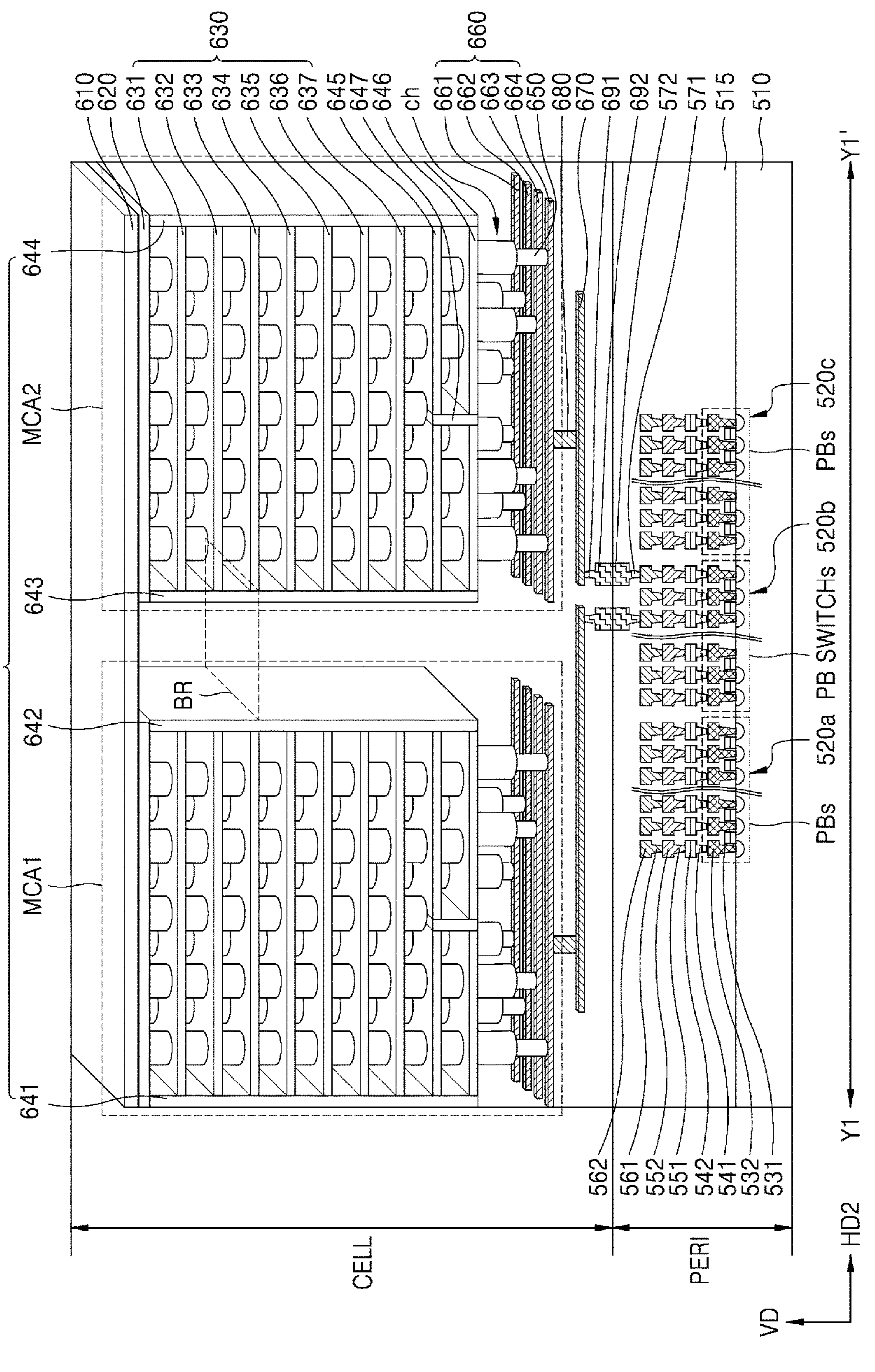
FIGS. 11A and 11B are diagrams for describing memory devices according to an embodiment, respectively.
Figure 11B:
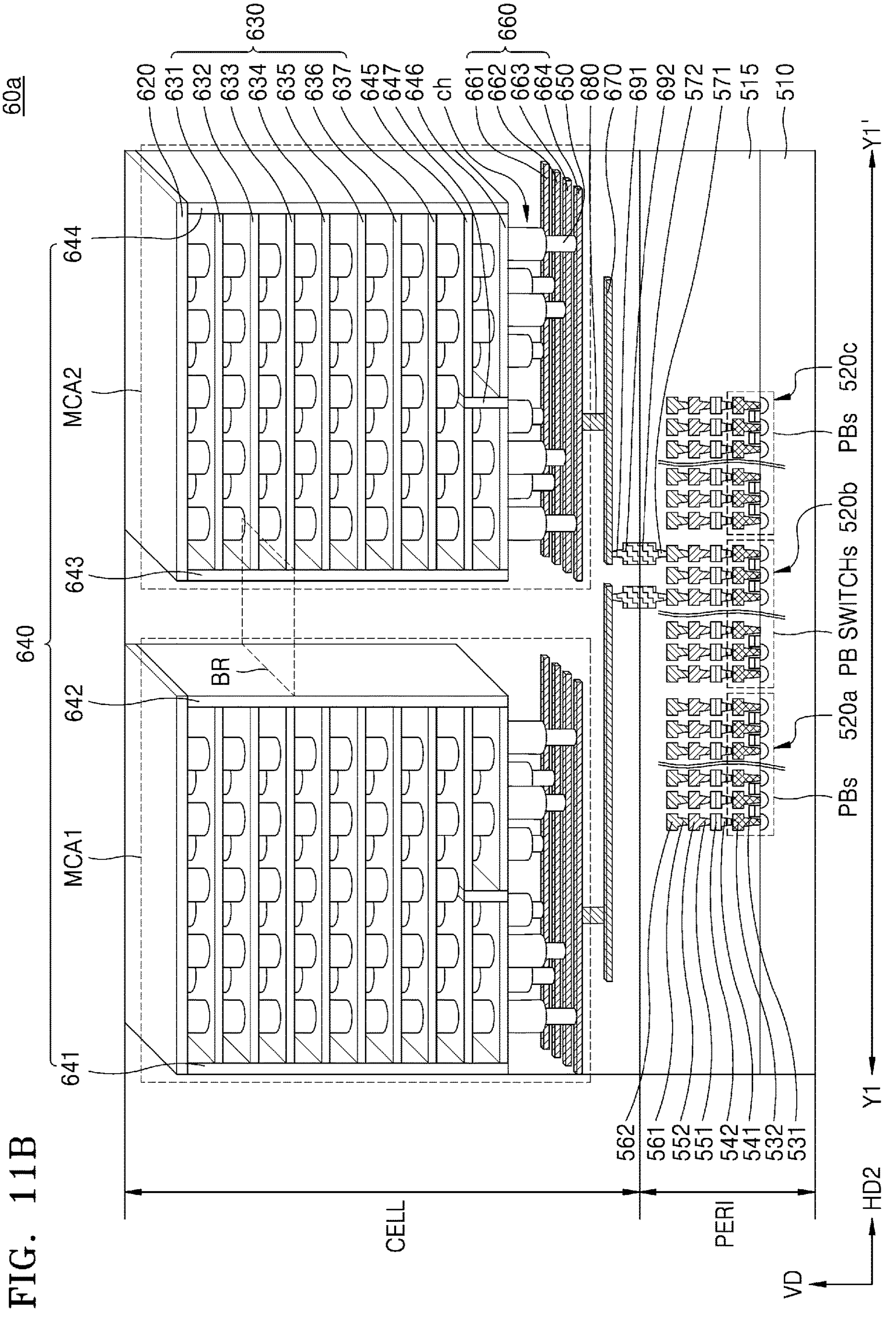

FIGS. 11A and 11B are diagrams for describing memory devices 60*a* and 60*b* according to an embodiment, respectively. In detail, FIGS. 11A and 11B are diagrams for describing a cross section obtained along a line Y1-Y1' of FIG. 10.

Referring to FIG. 11A, a memory device 60*a* may have a chip-to-chip (C2C) structure, and descriptions identical to those already given above with reference to FIG. 5 may be omitted. A cell region CELL may include the first memory cell array MCA1 and the second memory cell array MCA2. The first memory cell array MCA1 and the second memory cell array MCA2 may be formed on a substrate 610. The first memory cell array MCA1 and the second memory cell array MCA2 may each include a common source line 620 and a plurality of word lines 631 to 637: 630 stacked thereon.

The first memory cell array MCA1 and the second memory cell array MCA2 may be defined by word line cuts 641 to 644: 640. The plurality of word lines 630 may be terminated by the word line cuts 640. The word line cuts 640 may include, for example, an insulation layer that contacts the ends of the word lines 630 for each memory cell array. The first memory cell array MCA1 and the second memory cell array MCA2 may each include a first string select line 645 and a second string select line 646. The first string select line 645 and the second string select line 646 may be terminated by string select line cuts 647 (which may include an insulation layer). The boundary region BR may be formed between the first memory cell array MCA1 and the second memory cell array MCA2. The boundary region BR may be defined by word line cuts 642 and 643. The boundary region BR may be a region between first ends (e.g., first end surfaces) of word lines of the first memory cell array MCA1 and second ends (e.g., second end surfaces) of word lines of the second memory cell array MCA2, for example facing the first ends, and may include one or more insulating materials (e.g., an oxide layer, air, etc.).

A first metal contact 650 and a plurality of bit lines 661-664: 660 may correspond to a first metal wire 350*c* or a second metal wire 360*c* of FIG. 5. The plurality of bit lines 660 may be referred to as first metal wires. The cell region CELL may further include a second metal contact 680 and second metal wires 670. The second metal contact 680 and the second metal wires 670 may be connected to the plurality of bit lines 660 in a region that does not overlap the boundary region BR in the vertical direction. The second metal contact 680 and the second metal wires 670 may extend in the second horizontal direction HD2, thereby being connected to upper bonding metals 692 of the cell region CELL. At least some of the connection locations between the upper bonding metals 692 and the second metal wires 670 may be in a region overlapping the boundary region BR in the vertical direction.

The peripheral circuit region PERI may include a plurality of circuit elements 520*a*, 520*b*, and 520*c* formed in a first substrate 510. Circuit elements 520*a* and 520*c* may be included in the plurality of page buffers PBs, and a circuit element 520*b* may be included in the plurality of page buffer switches PB SWITCHs. The plurality of circuit elements 520*a*, 520*b*, and 520*c* may be connected to the cell region CELL by being connected to a first metal contact 531, a first metal wire 532, a second metal contact 541, a second metal wire 542, a third metal contact 551, a third metal wire 552, a fourth metal contact 561, a fourth metal wire 562, and an upper bonding contact 571 and a upper bonding metal 572 of the peripheral circuit region PERI. The metal contacts 531, 541, 551, 561, and 571 may extend vertically and may described as vias. The upper bonding metal 572, as well as the upper bonding metal 692 may be described as bonding pads.

According to an embodiment, some or all of the page buffer switches PB SWITCHs may be arranged in a region overlapping the boundary region BR in the vertical direction (e.g., from a plan view). Also, the upper bonding metal 572 of the peripheral circuit region PERI may be connected to an upper bonding metal 692 of the cell region CELL in the region overlapping the boundary region BR in the vertical direction.

Some of the plurality of page buffers PBs may be arranged adjacent to the page buffer switches PB SWITCHs and may be arranged in a region that does not overlap the boundary region BR in the vertical direction. Some of the plurality of page buffers PBs may overlap the first memory cell array MCA1 in the vertical direction.

The remaining of the plurality of page buffers PBs may be arranged adjacent to the page buffer switches PB SWITCHs and may be arranged in a region that does not overlap the boundary region BR in the vertical direction. The remaining of the plurality of page buffers PBs may overlap the second memory cell array MCA2 in the vertical direction.

The plurality of page buffers PBs may each be connected to the first bit line BL1 of the first memory cell array MCA1 and the second bit line BL2 of the second memory cell array MCA2 in common, for example through the page buffer switches PG SWITCHs. Also, the page buffer switches PB SWITCHs may selectively connect the first bit line BL1 or the second bit line BL2 to a page buffer. Therefore, the first memory cell array MCA1 and the second memory cell array MCA2 may share each of the plurality of page buffers PBs. As described herein, items connected, for example through a switch or group of switches that either allow a signal to pass between the items or prevent a signal from passing between the items, may be described as electrically connected. Items in communication with each other, for example due to a switch or group of switches being in a state that allows a signal to pass between them, are described as communicatively connected. Therefore, in the example above, the plurality of page buffers PBs may each be electrically connected to the first bit line BL1 of the first memory cell array MCA1 and the second bit line BL2 of the second memory cell array MCA2 in common, for example through the page buffer switches PG SWITCHs. Also, the page buffer switches PB SWITCHs may selectively communicatively connect the first bit line BL1 and/or the second bit line BL2 to a page buffer.

Referring to FIG. 11B, the memory device 60*b* may not include the substrate 610, unlike the memory device 60*a*. For example, in the memory device 60*b*, the plurality of word lines 630 are stacked on each of separated common source lines 620, and thus the first memory cell array MCA1 and the second memory cell array MCA2 may be formed.

Figure 12A:
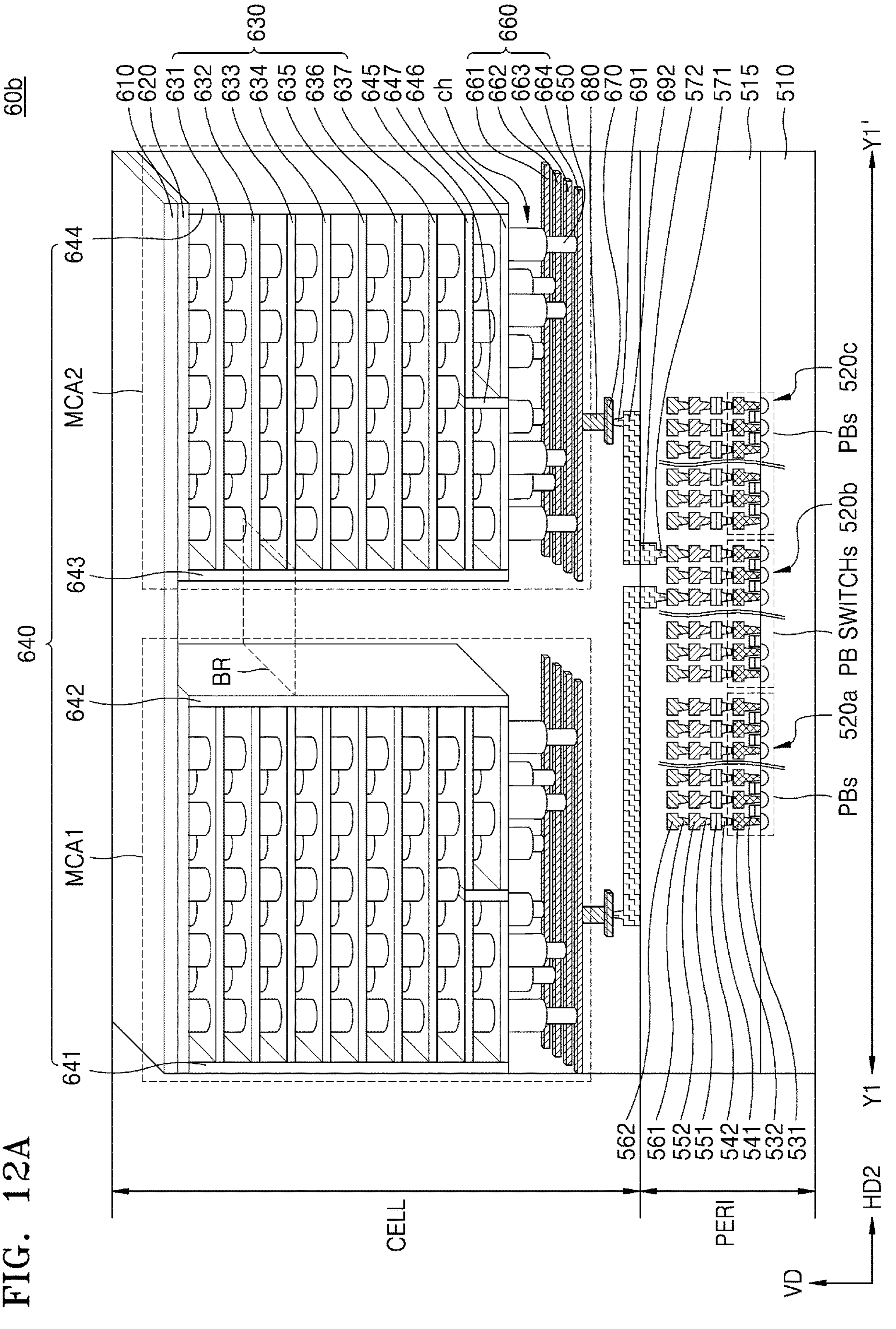
FIGS. 12A and 12B are diagrams for describing memory devices according to an embodiment, respectively.
Figure 12B:
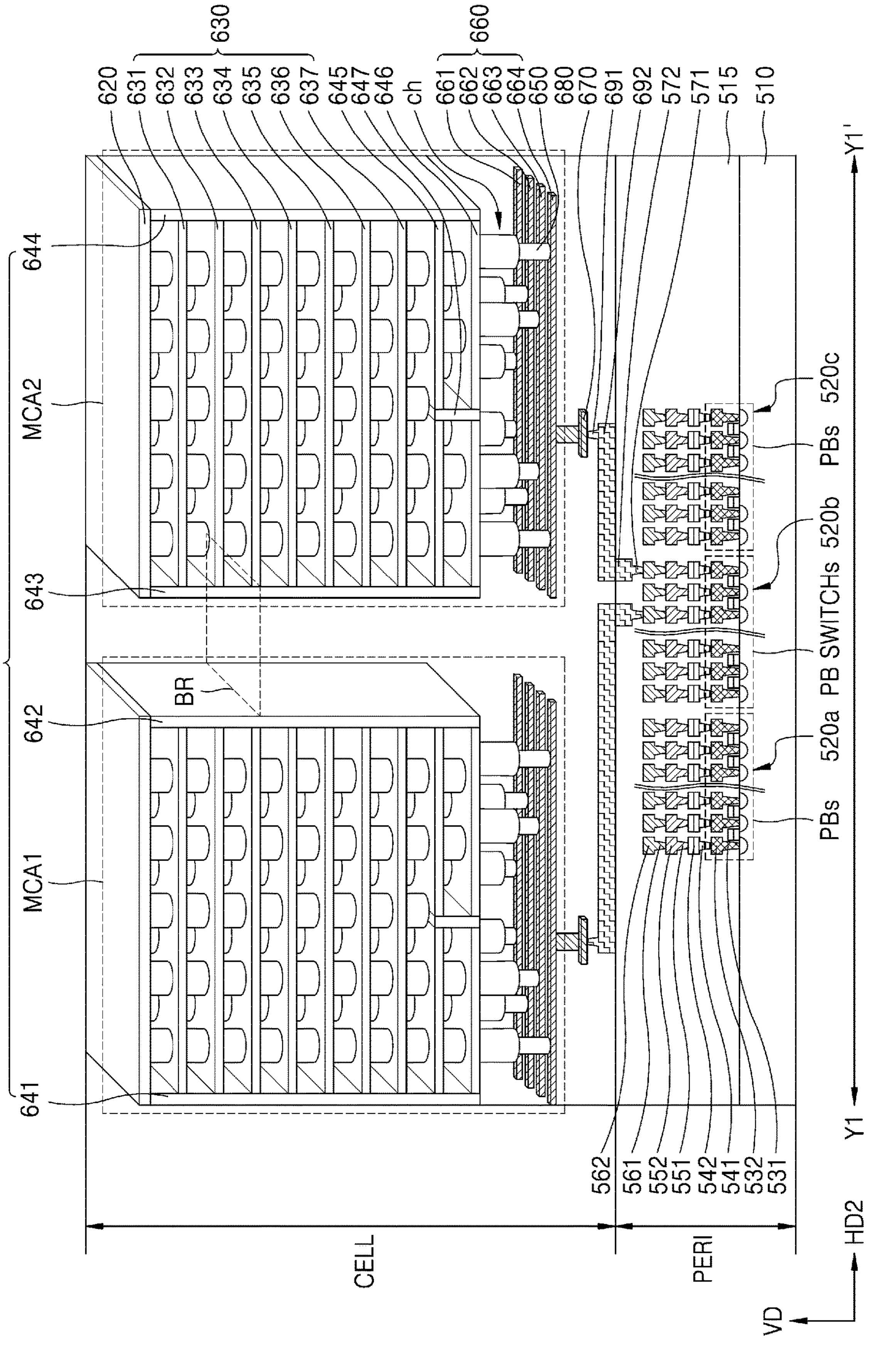

FIGS. 12A and 12B are diagrams for describing memory devices 70*a* and 70*b* according to an embodiment, respectively.

Referring to FIG. 12A, a memory device 70*a* may include the cell region CELL and the peripheral circuit region PERI.

The second metal contact 680 and the second metal wires 670 of the cell region CELL may be connected to an upper bonding contact 691 (which may be described as an upper bonding wire) and the upper bonding metal 692 of the cell region CELL in a region that does not overlap the boundary region BR.

The upper bonding metal 692 may extend in the second horizontal direction HD2 and may be connected to an upper bonding metal 672 of the peripheral circuit region PERI in a region overlapping the boundary region BR. As the upper bonding contact 571 connected to the upper bonding metal 672 is connected to the page buffer switch PB SWITCH, the first bit line BL1 of the first memory cell array MCA1 and the second bit line BL2 of the second memory cell array MCA2 may share the page buffer switch PB SWITCH. The upper bonding metal 692 may have a greater thickness (e.g., in the vertical direction) than the second metal wires 670.

Referring to FIG. 12B, the memory device 70*b* may not include the substrate 610, unlike the memory device 70*a*. For example, in the memory device 70*b*, the plurality of word lines 630 are stacked on each of separated common source lines 620, and thus the first memory cell array MCA1 and the second memory cell array MCA2 may be formed.

Figure 13A:
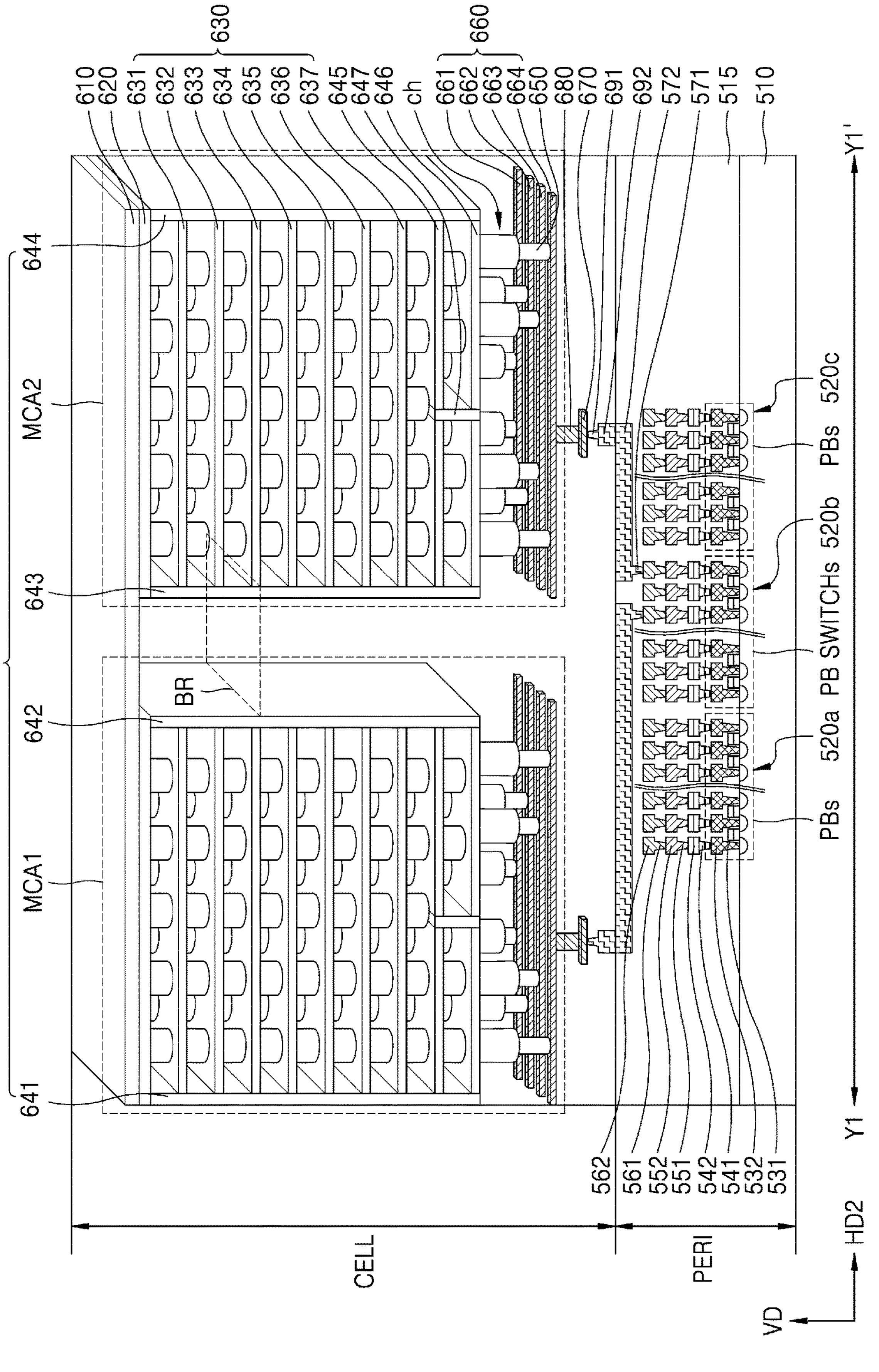
FIGS. 13A and 13B are diagrams for describing memory devices according to an embodiment, respectively.
Figure 13B:
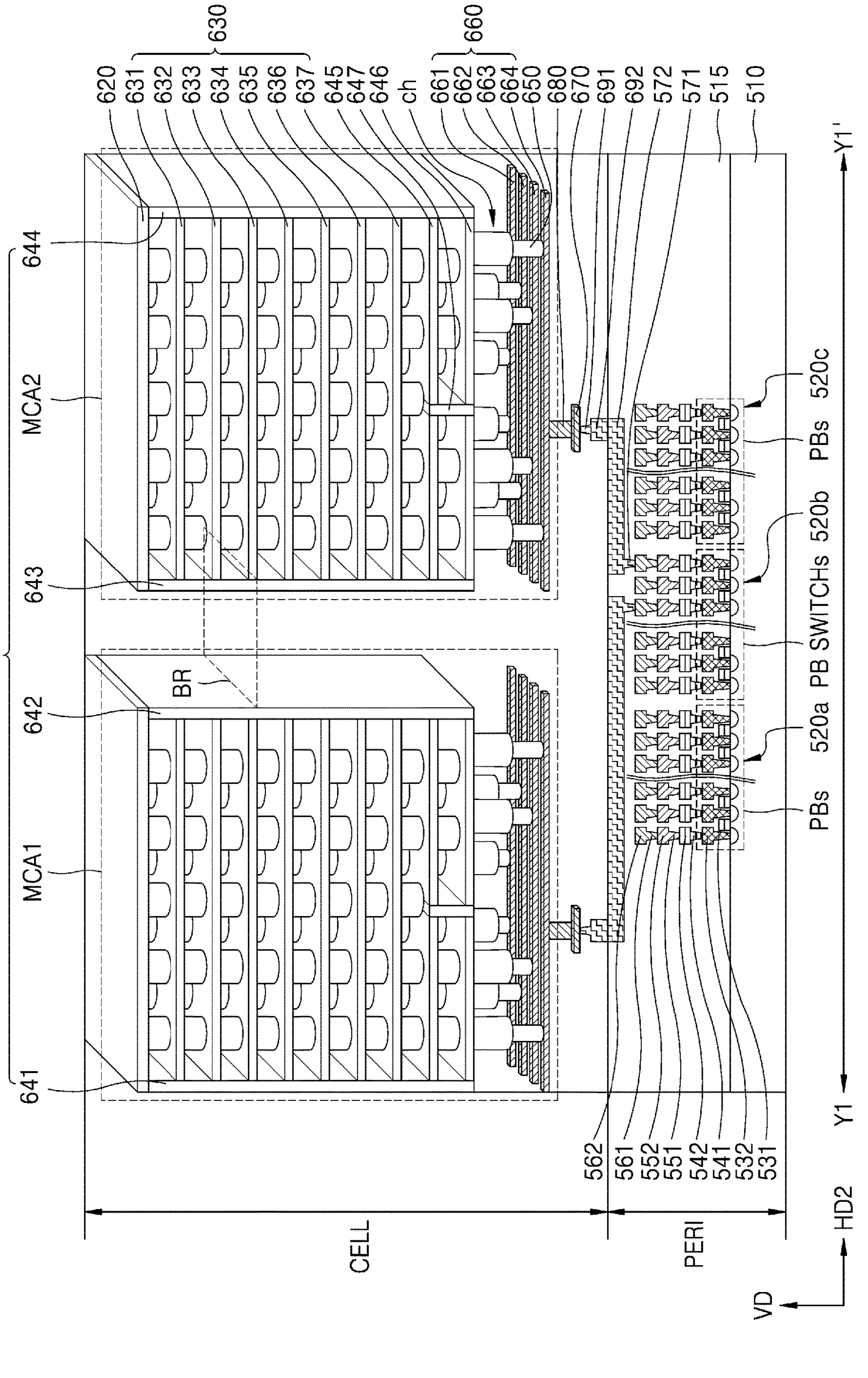

FIGS. 13A and 13B are diagrams for describing memory devices 80*a* and 80*b* according to an embodiment, respectively.

Referring to FIG. 13A, a memory device 80*a* may include the cell region CELL and the peripheral circuit region PERI.

The second metal contact 680 and the second metal wires 670 of the cell region CELL may be connected to the upper bonding contact 691 and the upper bonding metal 692 of the cell region CELL in a region that does not overlap the boundary region BR. The upper bonding metal 692 may be connected to the upper bonding metal 572 of the peripheral circuit region PERI in a region that does not overlap the boundary region BR.

The upper bonding metal 572 may extend in the second horizontal direction HD2 and may be connected to the upper bonding contact 571 in a region overlapping the boundary region BR. As the upper bonding contact 571 is connected to the page buffer switch PB SWITCH, the first bit line BL1 of the first memory cell array MCA1 and the second bit line BL2 of the second memory cell array MCA2 may share the page buffer switch PB SWITCH.

Referring to FIG. 13B, a memory device 80*b* may not include the substrate 610, unlike the memory device 80*a*. For example, in the memory device 80*b*, the plurality of word lines 630 are stacked on each of separated common source lines 620, and thus the first memory cell array MCA1 and the second memory cell array MCA2 may be formed.

FIGS. 14A to 14D are perspective views of wires connecting the page buffer switch PB SWITCH and the page buffer PB according to an embodiment. FIGS. 14A to 14D are described below with reference to FIG. 7.

Figure 14A:
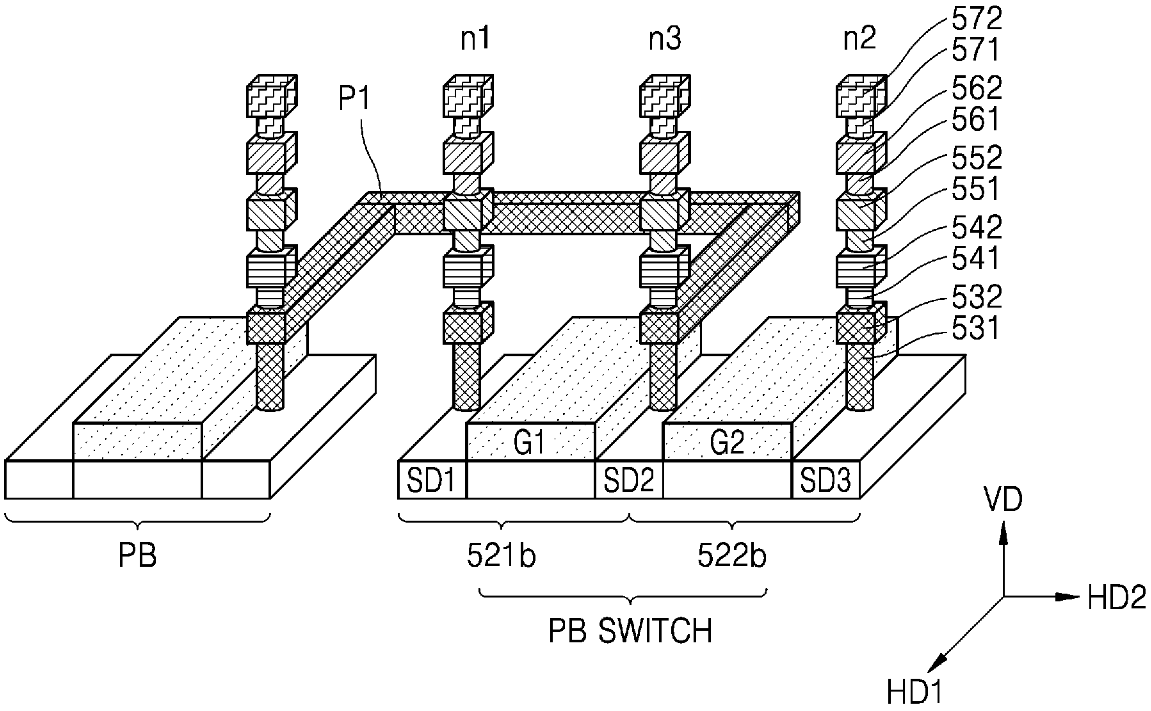
FIGS. 14A to 14D are perspective views of wires connecting a page buffer switch and a page buffer according to an embodiment.

Referring to FIG. 14A, the page buffer switch PB SWITCH may include circuit elements 521*b* and 522*b*. A circuit element 521*b* may be defined by a gate electrode G1 and source/drain regions SD1 and SD2, and a circuit element 522*b* may be defined by a gate electrode G2 and source/drain regions SD2 and SD3. These circuit elements may be transistors, for example.

A source/drain region SD1 of the circuit element 521*b* may be connected to the first node n1, and a source/drain region SD2 may be connected to the third node n3. For example, the circuit element 521*b* may correspond to the first bit line select transistor TR1_*hv* of FIG. 7.

A source/drain region SD3 of the circuit element 522*b* may be connected to the second node n2, and the source/drain region SD2 may be connected to the third node n3. For example, the circuit element 522*b* may correspond to the second bit line select transistor TR2_*hv* of FIG. 7.

Referring to FIG. 14A, the third node n3 may be connected to the page buffer PB (e.g., the page buffer PB of FIG. 7) through a first wire P1. The first wire P1 may be formed by using the first metal wire 532, but embodiments are not limited thereto. The first wire P1 may freely extend in the first horizontal direction HD1 and the second horizontal direction HD2 to connect the third node n3 and the page buffer PB. The page buffer PB may correspond to the page buffer PB shown in FIGS. 11 to 13.

Figure 14B:
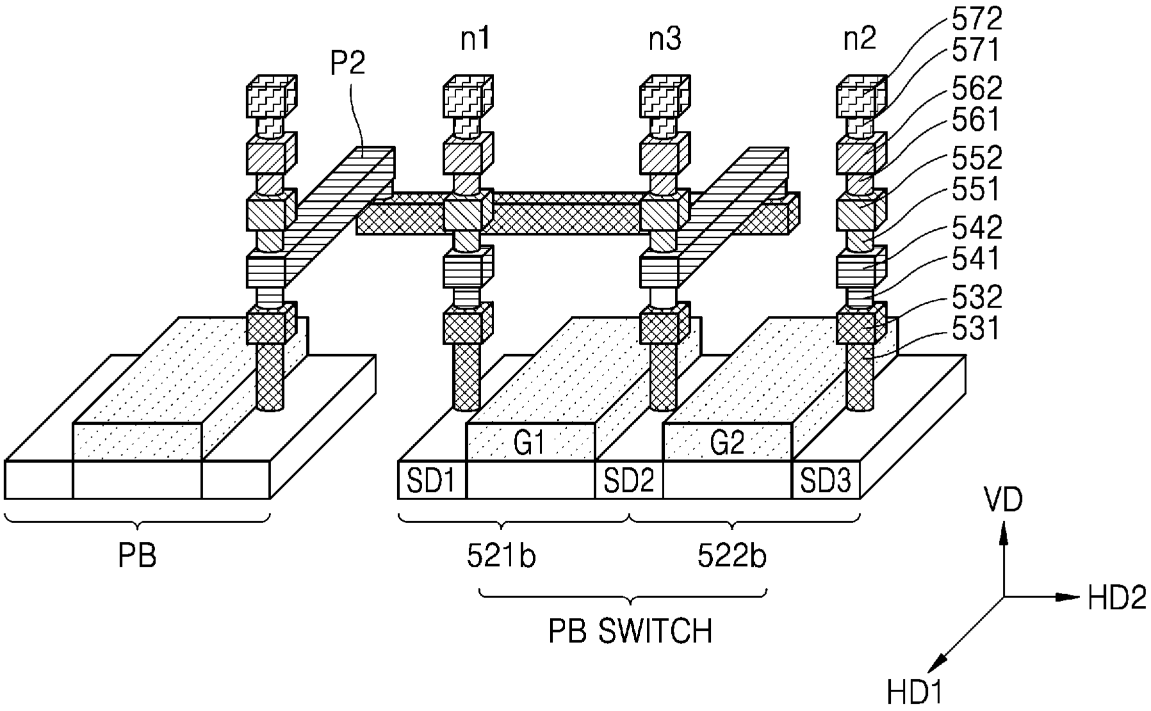

Referring to FIG. 14B, the third node n3 may be connected to the page buffer PB (e.g., the page buffer PB of FIG. 7) through a second wire P2. Although FIG. 14B shows that the second wire P2 is formed using the first metal wire 532 extending in the second direction HD2 and the second metal wire 542 extending in the first horizontal direction HD1, embodiments are not limited thereto. The second wire P2 may be formed using at least two metal wires from among the first to fourth metal wires 532, 542, 552, and 562, and the upper bonding metal 572. The page buffer PB may correspond to the page buffer PB shown in FIGS. 11 to 13.

Figure 14C:
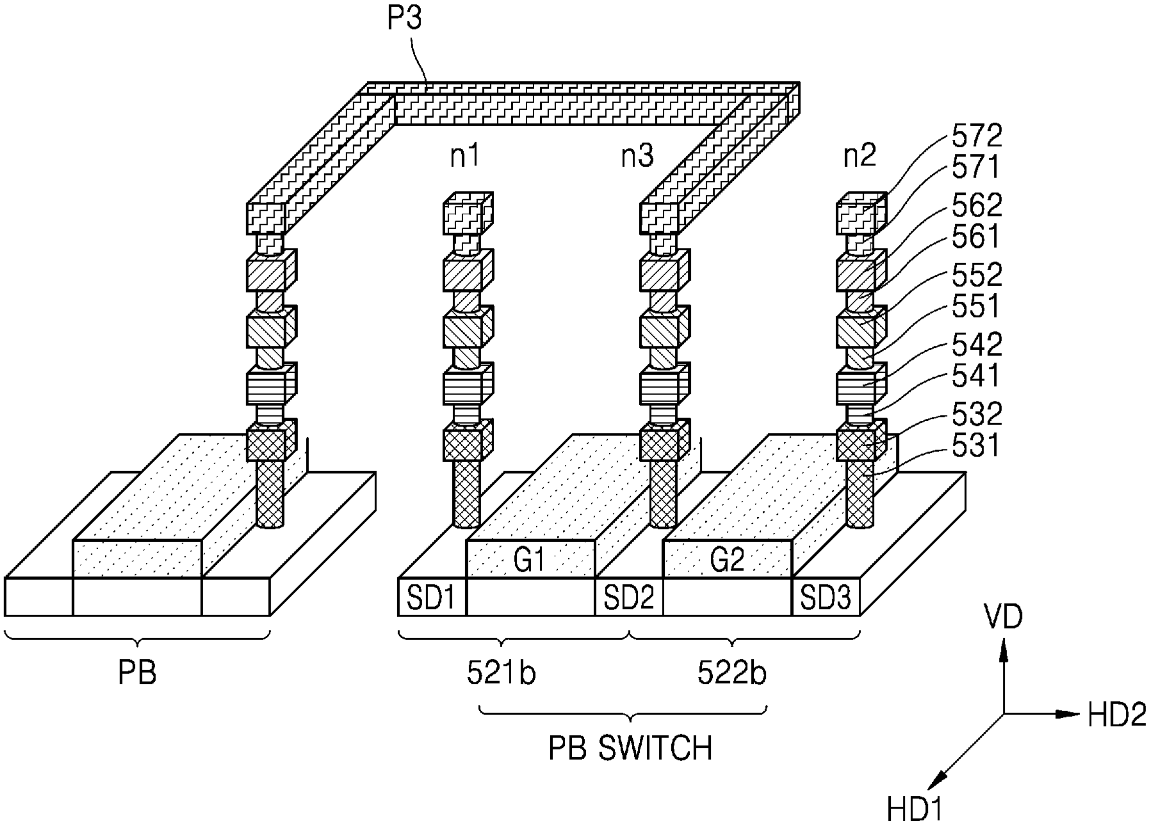

Referring to FIG. 14C, the third node n3 may be connected to the page buffer PB (e.g., the page buffer PB of FIG. 7) through a third wire P3. As shown in FIG. 14C, the third wire P3 may be formed using the upper bonding metal 572 of the peripheral circuit region PERI. The third wire P3 may freely extend in the first horizontal direction HD1 and the second horizontal direction HD2 to connect the third node n3 and the page buffer PB. The page buffer PB may correspond to the page buffer PB shown in FIGS. 11 to 13.

Figure 14D:
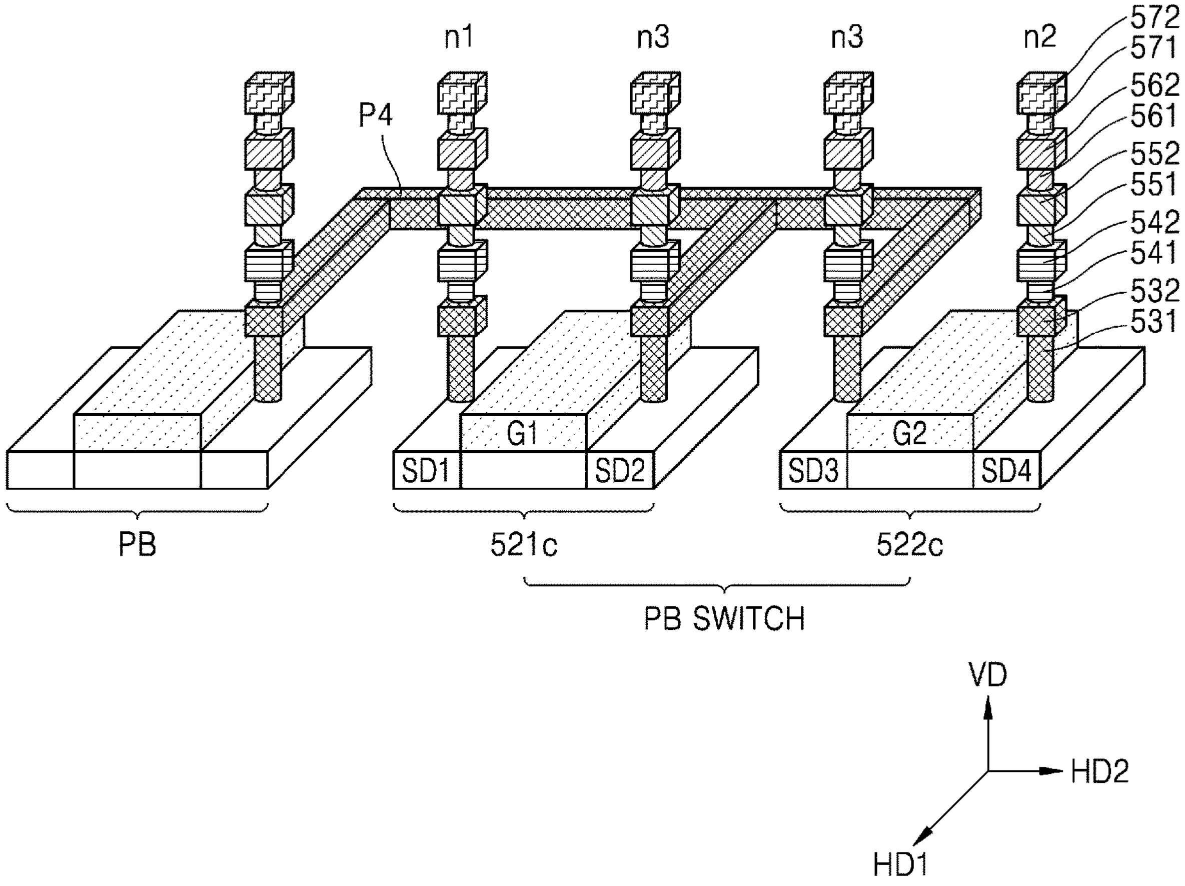

Referring to FIG. 14D, unlike the circuit elements 521*b* and 522*b* sharing a common source/drain region SD2 in FIGS. 14A to 14C, circuit elements 521*c* and 522*c* may not share a source/drain region. For example, a circuit element 521*c* may include the first source/drain region SD1 and the second source/drain region SD2, and a circuit element 522*c* may include the third source/drain region SD3 and a fourth source/drain region SD4. Therefore, the circuit element 521*c* and the circuit element 522*c* may be spaced apart from each other.

Referring to FIG. 14D, the third node n3 may be connected to the page buffer PB (e.g., the page buffer PB of FIG. 7) through a fourth wire P4. The fourth wire P4 may be implemented according to the embodiment described above with reference to FIGS. 14A to 14C.

Figure 15A:
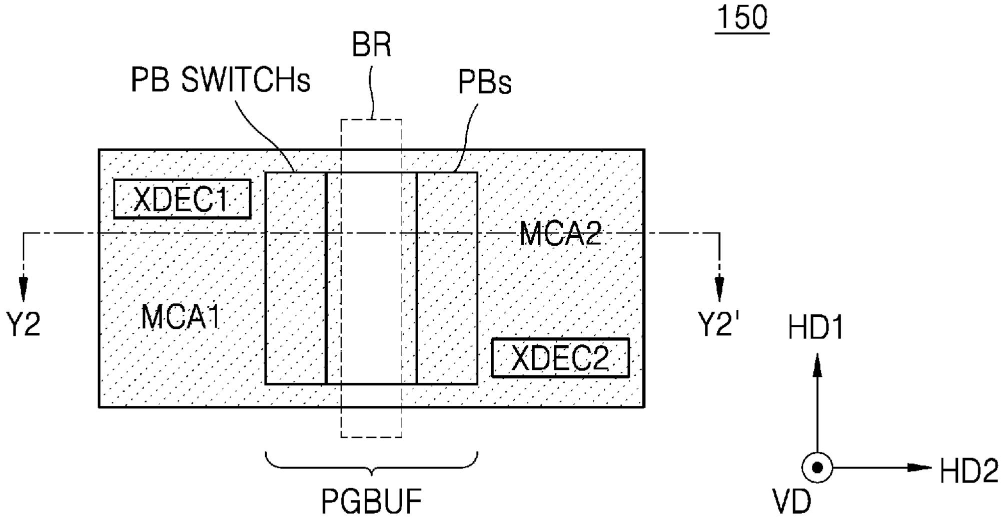
FIG. 15A is a top view of a memory device in which a cell region and a peripheral circuit region overlap in a vertical direction.
Figure 15B:
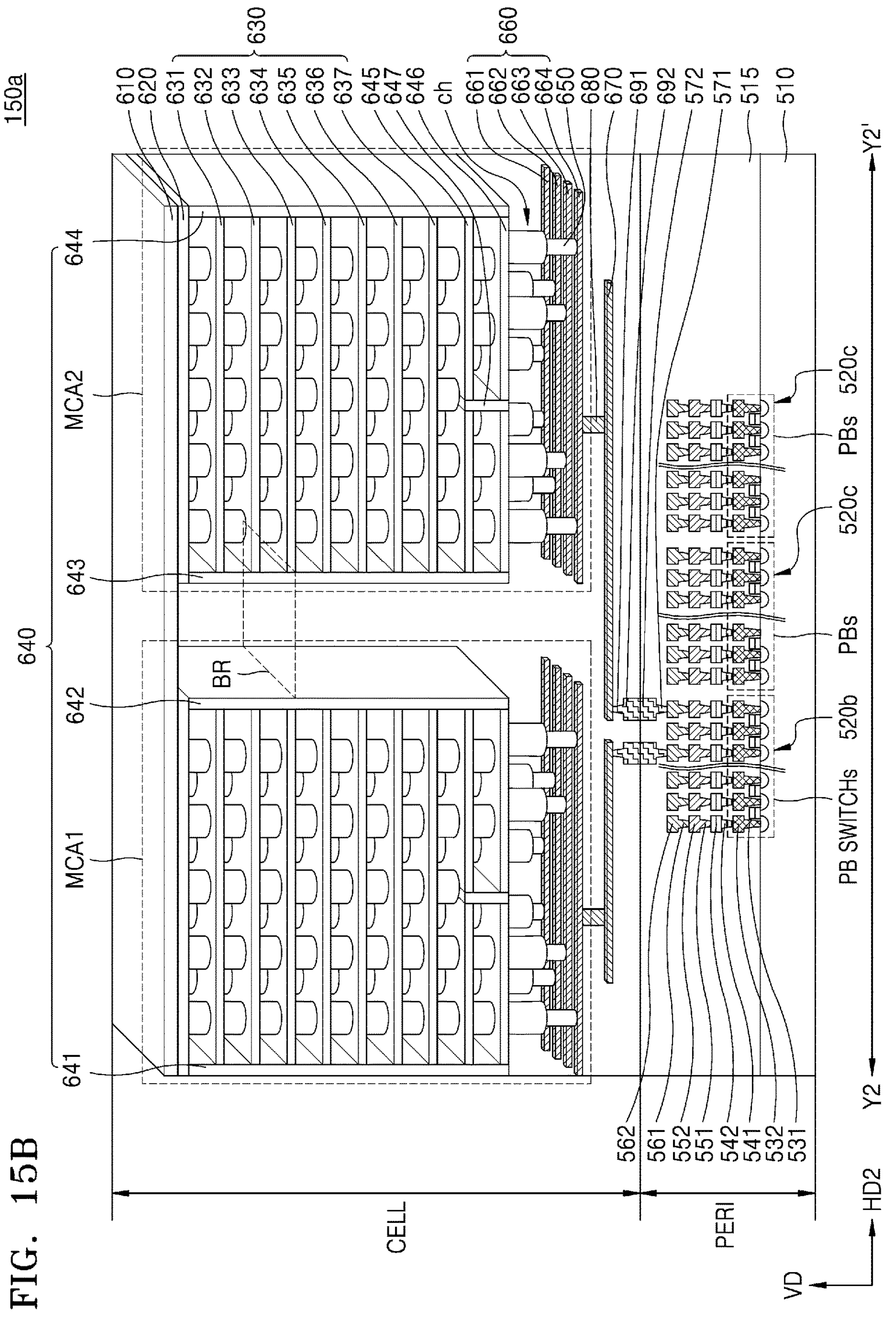
FIGS. 15B and 15C are cross-sectional views of memory devices obtained along a line Y2-Y2'.
Figure 15C:
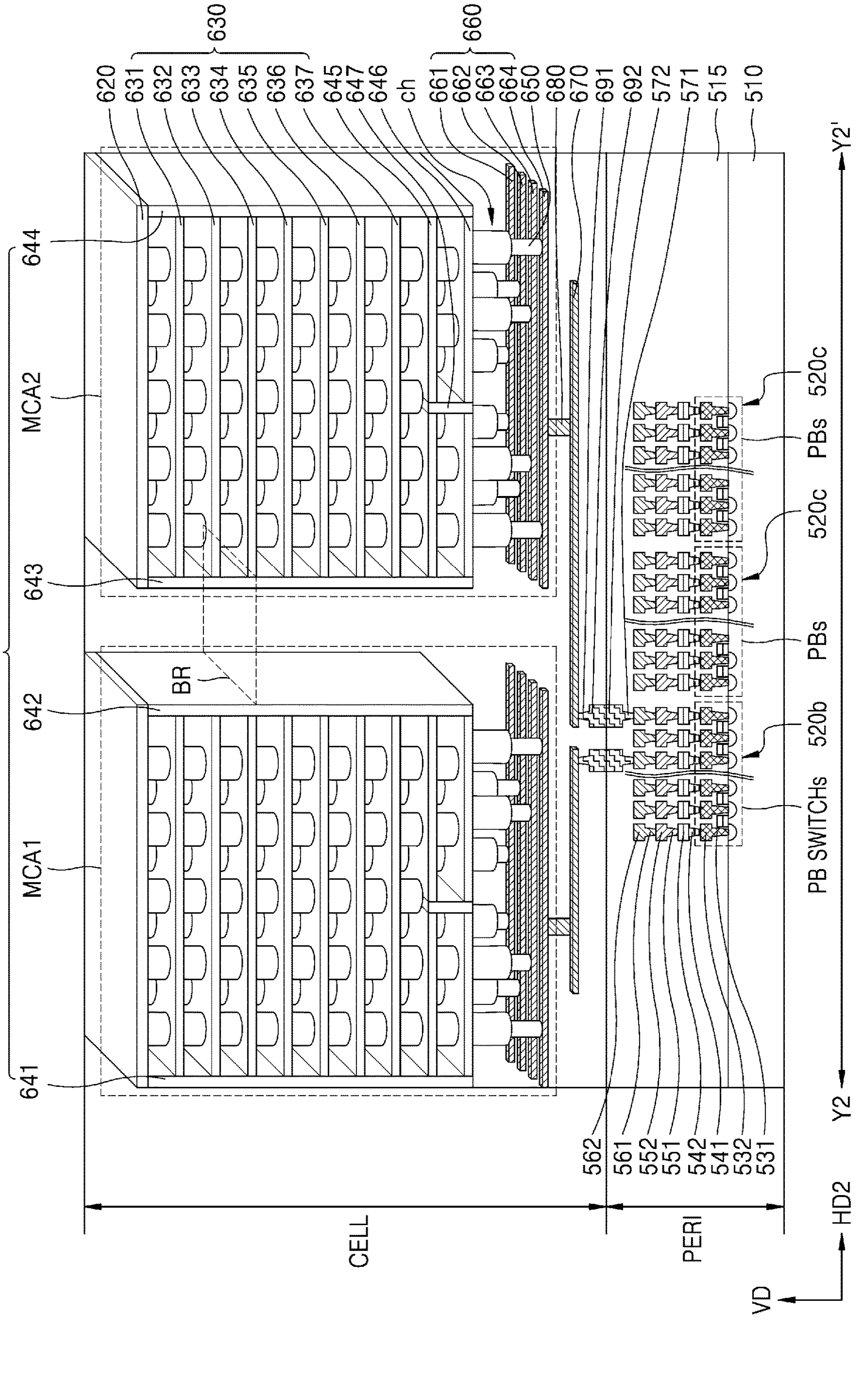

FIG. 15A is a top view of a memory device 150 in which the cell region CELL and the peripheral circuit region PERI overlap in the vertical direction VD. FIGS. 15B and 15C are cross-sectional views of the memory device 150 obtained along a line Y2-Y2'.

Referring to FIG. 15A, at least part of the page buffers PBs may be arranged in a region overlapping the boundary region BR in the vertical direction VD. The boundary region BR may be a region in which a word line does not exist due to word line cuts. The page buffer switches PB SWITCHs may be arranged in a region overlapping the first memory cell array MCA1 in the vertical direction. The page buffer switches PB SWITCHs and the page buffers PBs may be arranged adjacent to each other in the second horizontal direction HD2.

Referring to FIG. 15B, the page buffers PBs may be arranged in a region overlapping the boundary region BR in the vertical direction VD. The page buffer switches PB SWITCHs may be arranged in a region that does not overlap the boundary region BR in the vertical direction VD. In detail, the upper bonding metal 692 of the cell region CELL and the upper bonding metal 572 of the peripheral circuit region PERI may be connected to each other in a region that does not overlap the boundary region BR in the vertical direction VD. Although FIG. 15B shows that upper bonding metals 692 and 572 are arranged in a region overlapping the first memory cell array MCA1 in the vertical direction VD, embodiments are not limited thereto. The upper bonding metals 692 and 572 may be arranged in a region overlapping the second memory cell array MCA2 in the vertical direction VD. Meanwhile, although FIG. 15B shows that the second metal wires 670 of the cell region CELL are connected to the first memory cell array MCA1 and the second memory cell array MCA2 and extend toward the upper bonding metal 692 in the second horizontal direction HD2, embodiments are not limited thereto. For example, as described above with reference to FIGS. 12 and 13, the upper bonding metals 692 and 572 may extend in the second horizontal direction HD2, thereby connecting the bit lines 660 and the page buffer switches PB SWITCHs.

Referring to FIG. 15C, a memory device 150*b* may not include the substrate 610, unlike a memory device 150*a*. For example, in the memory device 150*b*, the plurality of word lines 630 are stacked on each of separated common source lines 620, and thus the first memory cell array MCA1 and the second memory cell array MCA2 may be formed.

Figure 16A:
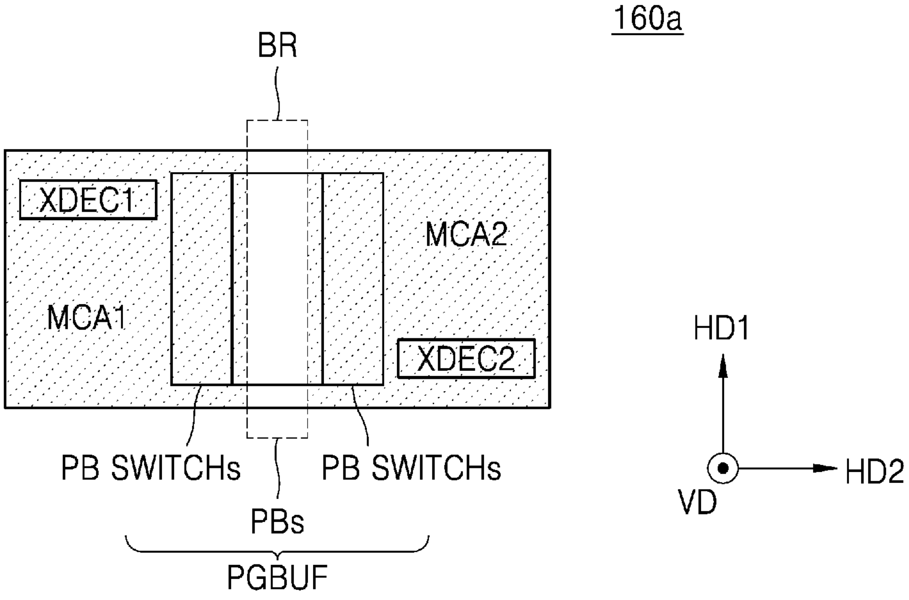
FIGS. 16A to 16C are top views of memory devices in each of which a cell region and a peripheral circuit region overlap in a vertical direction.
Figure 16B:
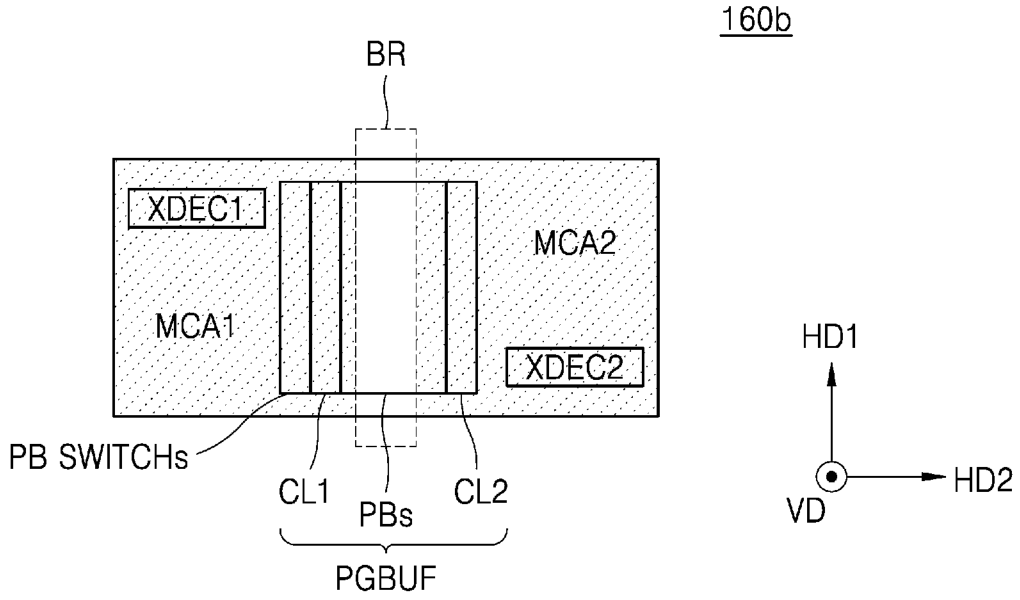
Figure 16C:
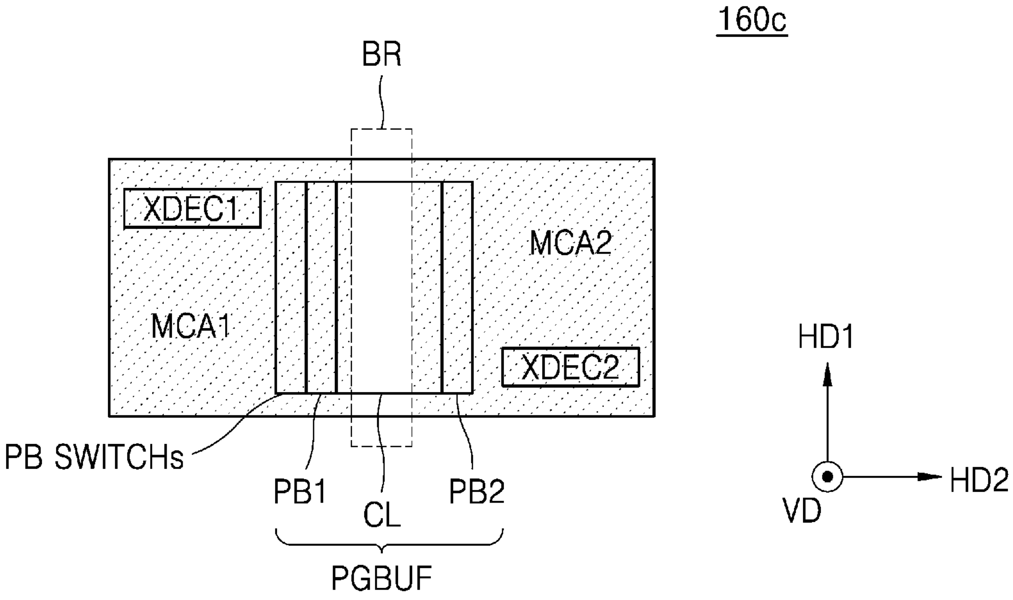

FIGS. 16A to 16C are top views of memory devices 160*a*, 160*b*, and 160*c* in each of which the cell region CELL and the peripheral circuit region PERI overlap in the vertical direction VD.

FIG. 16A is described below with reference to FIG. 14D. Referring to FIG. 16A, some or all of the page buffers PBs may be arranged in a region overlapping the boundary region BR in the vertical direction VD. Some of the page buffer switches PB SWITCHs may be arranged in a region overlapping the first memory cell array MCA1 in the vertical direction VD, and the remaining of the page buffer switches PB SWITCHs may be arranged in a region overlapping the second memory cell array MCA2 in the vertical direction VD.

Referring to FIGS. 14D and 16A, the circuit element 521*c* may be disposed in a region overlapping the first memory cell array MCA1 in the vertical direction VD, and the circuit element 522*c* may be disposed in a region overlapping the second memory cell array MCA2 in the vertical direction VD. For example, since the page buffer switches PB SWITCH that connect the first memory cell array MCA1 and the second memory cell array MCA2 to the page buffer PB in common may be spaced apart from each other, design freedom may be increased.

FIG. 16B is described below with reference to FIG. 7B. Referring to FIG. 16B, the page buffer circuit PGBUF may include the first cache latch CL1 and the second cache latch CL2. Since the first cache latch CL1 inputs/outputs data to/from the first memory cell array MCA1, the first cache latch CL1 may be disposed in a region overlapping the first memory cell array MCA1 in the vertical direction, thereby shortening a data transfer path. Since the second cache latch CL2 inputs/outputs data to/from the second memory cell array MCA2, the second cache latch CL2 may be disposed in a region overlapping the second memory cell array MCA2 in the vertical direction, thereby shortening a data transfer path.

FIG. 16C is described below with reference to FIG. 7C. Referring to FIG. 16C, the page buffer circuit PGBUF may include the first page buffer PB1 and the second page buffer PB2. Since the first page buffer PB1 controls operations on the first bit line BL1 of the first memory cell array MCA1, the first page buffer PB1 may be disposed in a region overlapping the first memory cell array MCA1 in the vertical direction, thereby shortening a data transfer path. Since the second page buffer PB2 controls operations on the second bit line BL2 of the second memory cell array MCA2, the second page buffer PB2 may be disposed in a region overlapping the second memory cell array MCA2 in the vertical direction, thereby shortening a data transfer path.

Figure 17A:
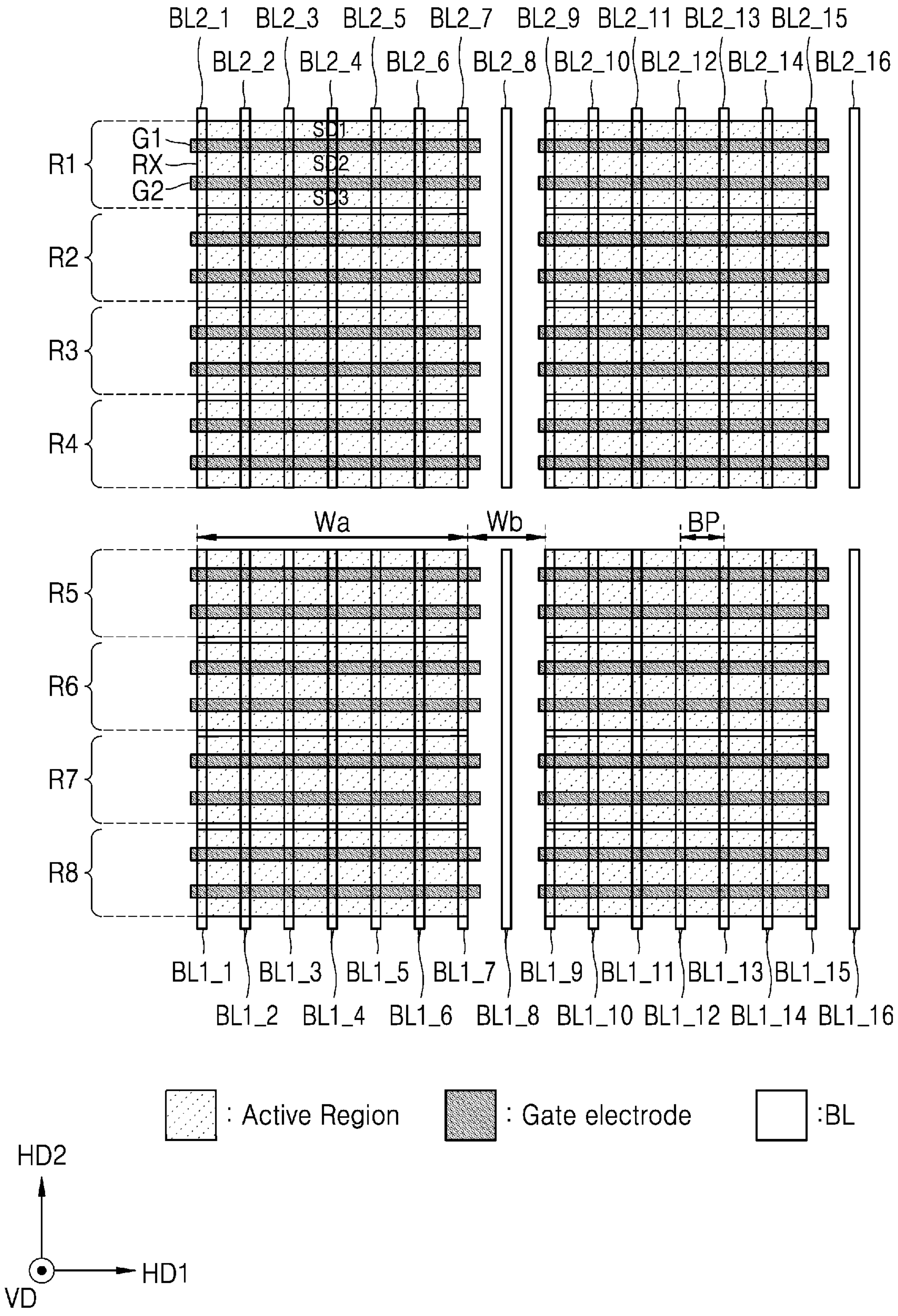
FIGS. 17A and 17B are diagrams for describing page buffer switches.
Figure 17B:
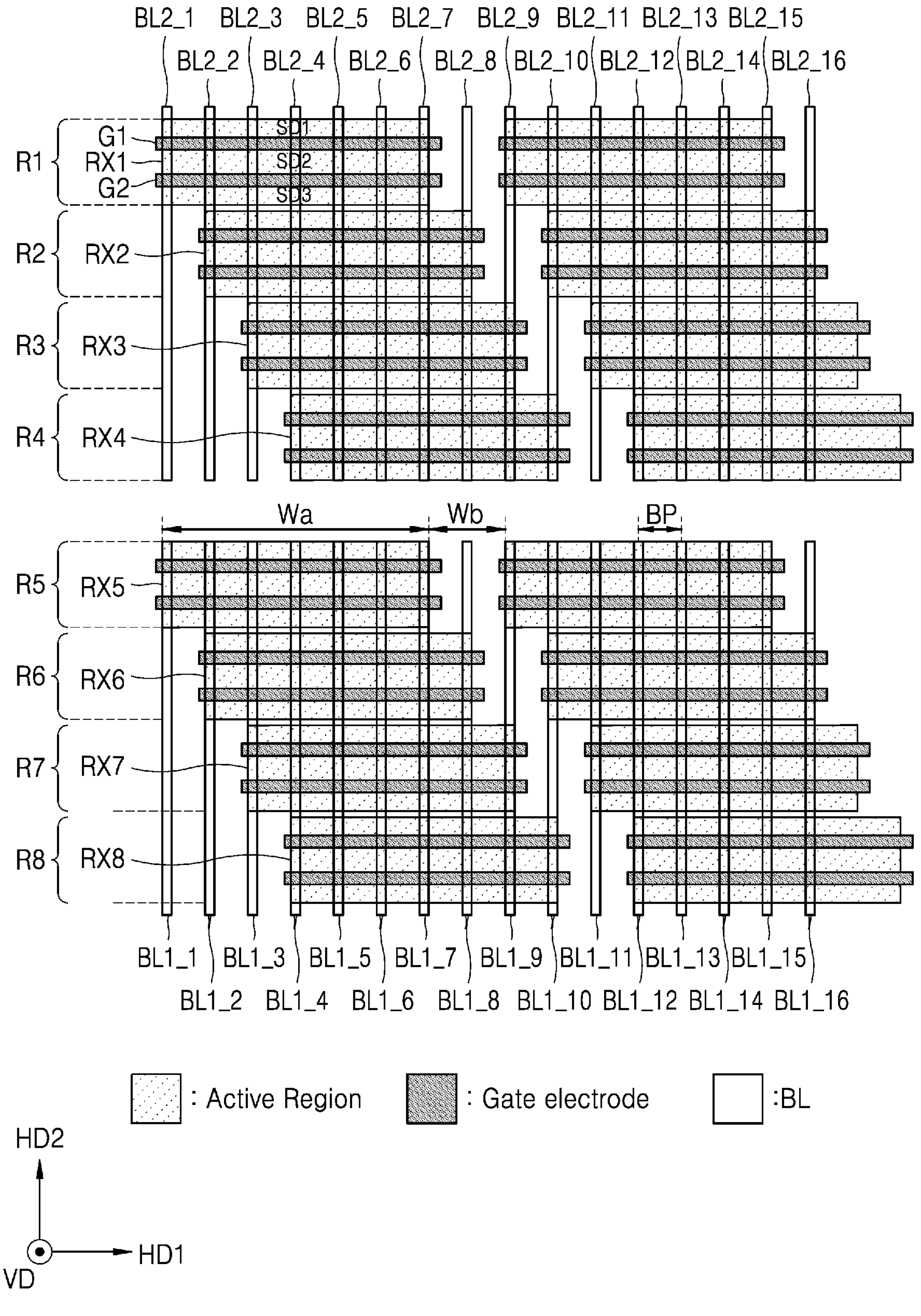

FIGS. 17A and 17B are diagrams for describing the page buffer switches PB SWITCHs. FIGS. 17A and 17B may be described below with reference to FIGS. 11A, 11B, and 14A to 14C.

Referring to FIG. 17A, active regions (e.g., RX) extending in the first horizontal direction HD1 and having a first length Wa may be formed in the first substrate 510. In FIG. 17A, 16 active regions may be arranged in first to eighth rows R1 to R8. In detail, the 16 active regions may be arranged to extend in the first horizontal direction HD1 in eight rows and may form in the second horizontal direction HD2 in two columns. The number of active regions and the numbers of rows and columns are not limited thereto. A distance between active regions adjacent to each another in the first horizontal direction HD1 may be a second width Wb.

Two gate electrodes (e.g., G1 and G2) may be formed on each active region (e.g., RX). Referring to FIG. 17A, 32 bit lines BL1_1 to BL1_16 and BL2_1 to BL2_16 may be arranged on the active regions. Bit lines BL1_1 to BL1_16 may be bit lines of the first memory cell array MCA1, and bit lines BL2_1 to BL2_16 may be bit lines of the second memory cell array MCA2. The bit lines BL2_1 to BL2_16 may be arranged on active regions aligned in first to fourth rows R1 to R4, and the bit lines BL1_1 to BL1_16 may be arranged on active regions aligned in fifth to eighth rows R5 to R8. A distance between bit lines adjacent to each other in the first horizontal direction HD1 may be a bit line pitch BP.

Page buffer switches (e.g., 521*b* and 522*b* of FIG. 14A) may be formed on an active region RX. The page buffer switches may be defined by gate electrodes G1 and G2 and first to third source/drain regions SD1 to SD3. As shown in FIGS. 14A and 17A, a page buffer switch 521*b* may be defined by the gate electrode G1, the source/drain region SD1, and the source/drain region SD2, and the page buffer switch 522*b* may be defined by the gate electrode G2, the source/drain region SD2, and the source/drain region SD3. Accordingly, in FIG. 17A, two transistors may be included in one active region.

The bit lines BL1_1 to BL1_16 of the first memory cell array MCA1 may each be connected to one of page buffer switches. For example, one of the bit lines BL1_1 to BL1_16 may be connected to the source/drain region SD1 of the page buffer switch 521*b*. The bit lines BL2_1 to BL2_16 of the second memory cell array MCA2 may each be connected to one of the page buffer switches. For example, one of the bit lines BL2_1 to BL2_16 may be connected to the source/drain region SD3 of the page buffer switch 522*b*. In detail, as shown in FIG. 14A, the bit lines BL1_1 to BL1_16 and BL2_1 to BL2_16 may be connected to the page buffer switches PB SWITCHs through metal contacts 531, 541, 551, and 561, metal wires 532, 542, 552, and 562, the upper bonding contact 571, and the upper bonding metal 572.

In FIG. 17B, 16 active regions may be aligned in the first horizontal direction HD1 and may be misaligned in the second horizontal direction HD2. Referring to FIG. 17B, first to fourth active regions RX1 to RX4 may be formed in the first substrate 510 in a stepped shape (from the plan view). For example, the boundary of a first active region RX1 may overlap a bit line BL2_1, the boundary of a second active region RX2 may be spaced apart from the bit line BL2_1 by the bit line pitch BP, the boundary of a third active region RX3 may be spaced apart from the bit line BL2_1 by twice the bit line pitch BP, and the boundary of a fourth active region RX4 may be spaced apart from the bit line BL2_1 by three times the bit line pitch BP. A distance spaced apart from the leftmost bit line BL2_1 may be referred to as an offset.

Although FIG. 17B shows that fifth to eighth active regions RX5 to RX8 are formed similarly as the first to fourth active regions RX1 to RX4, embodiments are not limited thereto. For example, the boundary of a fifth active region RX5 may be spaced apart from the bit line BL1_1 by four times the bit line pitch BP instead of overlapping the bit line BL1_1. According to some embodiments, a plurality of active regions RX1 to RX8 may be formed to be misaligned in the second horizontal direction HD2, and the minimum misalignment interval (or offset) may be the bit line pitch BP.

Referring to FIG. 17B, for example, page buffer switches formed in the first active region RX1 may be connected to bit lines BL1_1 and BL2_1, page buffer switches formed in the second active region RX2 may be connected to bit lines BL1_2 and BL2_2, page buffer switches formed in the third active region RX3 may be connected to bit lines BL1_3 and BL2_3, and page buffer switches formed in the fourth active region RX4 may be connected to bit lines BL_4 and BL2_4.

Figure 18A:
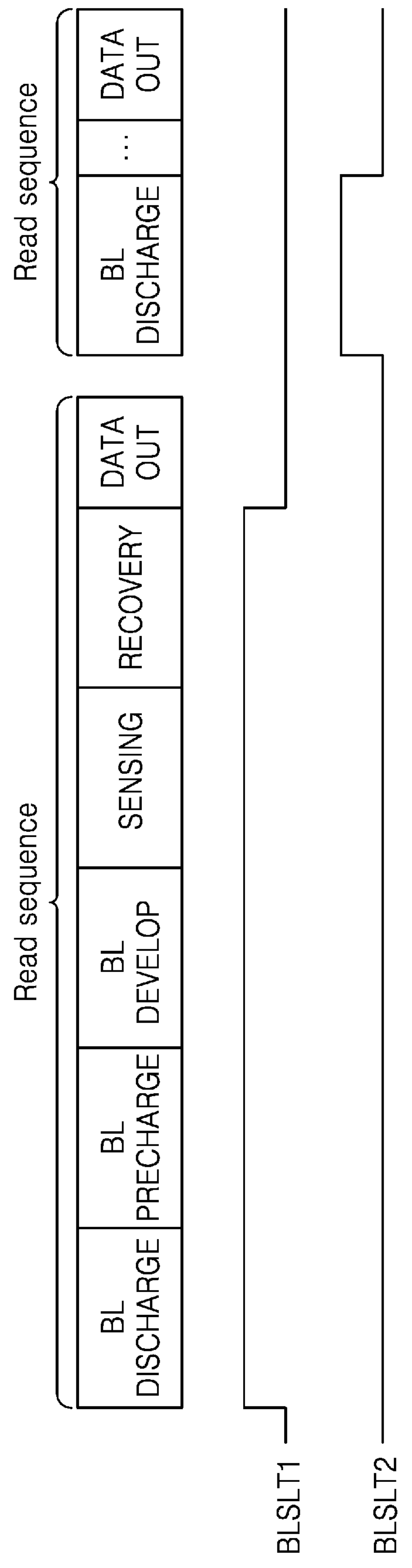
FIGS. 18A to 18C are timing diagrams for describing a method of operating a memory system according to an embodiment.
Figure 18B:
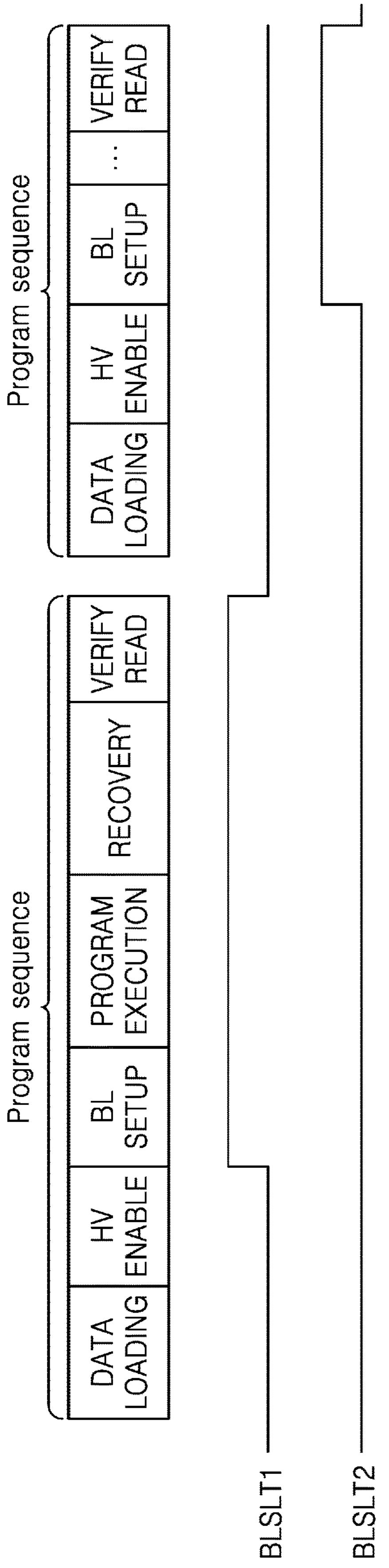
Figure 18C:
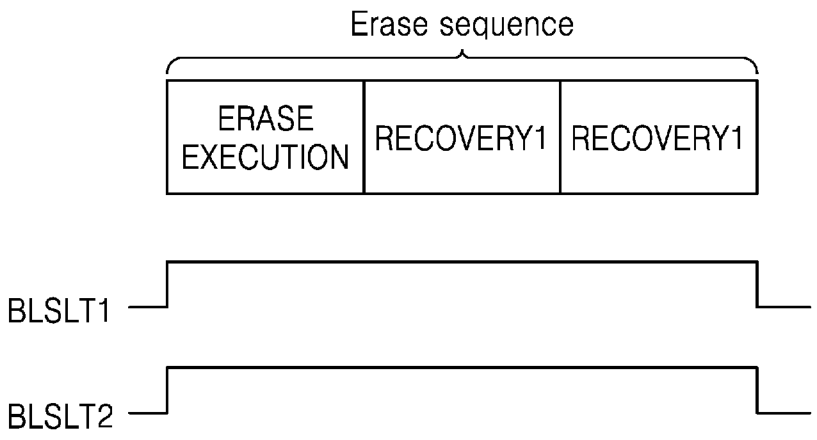

FIGS. 18A to 18C are timing diagrams for describing a method of operating a memory system according to an embodiment. FIGS. 18A to 18C may be described below with reference to FIG. 7. The method may be implemented by a controller, which instructs the memory device, so that the memory device is configured to perform the following operations.

Referring to FIG. 18A, read operations on the first memory cell array MCA1 and the second memory cell array MCA2 may be performed discontinuously or sequentially.

In detail, a read sequence may include a bit line discharge period BL DISCHARGE, a bit line precharge period BL PRECHARGE, a bit line develop period BL DEVELOP, a sensing period SENSING, a recovery period RECOVERY, and a data output period DATA OUT.

During a read operation on the first memory cell array MCA1, the first bit line select transistor TR1_*hv* may be turned on and the second bit line select transistor TR2_*hv* may be turned off. During a read operation on the second memory cell array MCA2, the second bit line select transistor TR2_*hv* may be turned on and the first bit line select transistor TR1_*hv* may be turned off.

For example, during a read operation on the first memory cell array MCA1, the first bit line select signal BLSLT1 may transition to a logic high level in the bit line discharge period BL DISCHARGE and may transition to a logic low level before the data output period DATA OUT. When the first bit line select signal BLSLT1 is at a logic high level, the first bit line select transistor TR1_*hv* is turned on, and thus an operation on the first bit line BL1 of the first memory cell array MCA1 may be performed. Since data sensed by the first memory cell array MCA1 through the sensing period SENSING may be stored in the page buffer PB, even when the first bit line select transistor TR1_*hv* is turned off in the data output period DATA OUT, sensed data may be output through the cache latch CL. A read operation on the second memory cell array MCA2 may also be performed in the same manner as the read operation on the first memory cell array MCA1.

Referring to FIG. 18B, program operations on the first memory cell array MCA1 and the second memory cell array MCA2 may be performed discontinuously or sequentially.

In detail, a program sequence may include a data loading period DATA LOADING, a high voltage enable period HV ENABLE, a bit line setup period BL SETUP, a program execution period PROGRAM EXECUTION, a recovery period RECOVERY, and a verification period VERIFY READ.

During a program operation on the first memory cell array MCA1, the first bit line select transistor TR1_*hv* may be turned on and the second bit line select transistor TR2_*hv* may be turned off. During a program operation on the second memory cell array MCA2, the second bit line select transistor TR2_*hv* may be turned on and the first bit line select transistor TR1_*hv* may be turned off.

For example, during a program operation on the first memory cell array MCA1, the first bit line select signal BLSLT1 may transition to a logic high level in the bit line setup period BL SETUP during which an operation on the first bit line BL1 is performed, and, when verification of the program operation is completed, the first bit line select signal BLSLT1 may transition to a logic low level.

Referring to FIG. 18C, erase operations on the first memory cell array MCA1 and the second memory cell array MCA2 may be simultaneously performed.

In detail, an erase sequence may include an erase execution period ERASE EXECUTION, a first recovery period RECOVERY1, and a second recovery period RECOVERY2.

Since an erase operation is performed block-by-block, by applying the same bit line voltage to the first bit line BL1 and the second bit line BL2, erase operations on the first memory cell array MCA1 and the second memory cell array MCA2 may be simultaneously performed.

Embodiments have been disclosed in the drawings and specification as described above. Although embodiments have been described by using specific terms in the present specification, these are only used for the purpose of explaining the inventive concept and are not used to limit the meaning or the scope of the claims.

While the inventive concept has been particularly shown and described with reference to embodiments thereof, it will be understood that various changes in form and details may be made therein without departing from the spirit and scope of the following claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A non-volatile memory device comprising:

a first semiconductor layer comprising a first cell region in which a first memory cell array is disposed, a second cell region in which a second memory cell array is disposed, and a first metal pad layer, wherein the first memory cell array and the second memory cell array each comprise a plurality of word lines stacked in a vertical direction, a plurality of memory cells respectively connected to the plurality of word lines, and a plurality of bit lines; and a second semiconductor layer comprising a page buffer circuit region in which a page buffer circuit connected to the first memory cell array and the second memory cell array is disposed, and a second metal pad layer, wherein the second semiconductor layer is connected to the first semiconductor layer in the vertical direction through bonding by the first metal pad layer and the second metal pad layer, wherein the page buffer circuit includes at least one transistor that overlaps a boundary region within the first semiconductor layer between the first cell region and the second cell region when viewed from the vertical direction, wherein the page buffer circuit comprises, within the second semiconductor layer:

a first switch connected between a page buffer and a first bit line connected to the first memory cell array;

a second switch connected between the page buffer and a second bit line connected to the second memory cell array; and the page buffer comprising a sensing latch connected to the first switch and the second switch in common, and wherein at least one of the first switch, the second switch, and the page buffer overlaps the boundary region when viewed from the vertical direction.

2. The non-volatile memory device of claim 1, wherein the first semiconductor layer comprises:

wires electrically connected to the plurality of bit lines; and first bonding pads connected to the wires in a region overlapping the boundary region when viewed from the vertical direction and forming the first metal pad layer, and the second semiconductor layer comprises second bonding pads connected to the first bonding pads in a region overlapping the boundary region when viewed from the vertical direction, the second bonding pads forming the second metal pad layer, and connected to the page buffer circuit.

3. The non-volatile memory device of claim 1, wherein the first metal pad layer comprises wires electrically connected to the plurality of bit lines in a region that does not overlap the boundary region when viewed from the vertical direction and extending to a region overlapping the boundary region when viewed from the vertical direction.

4. The non-volatile memory device of claim 1, wherein the first metal pad layer comprises first pads, which are electrically connected to the plurality of bit lines, and are connected to wires that form the first metal pad layer in a region that does not overlap the boundary region in the vertical direction, wherein the wires are connected to the page buffer circuit by extending to a region overlapping the boundary region when viewed from the vertical direction.

5. The non-volatile memory device of claim 1, wherein the second semiconductor layer further comprises first to fourth metal wire layers, and the first switch and the page buffer are connected to each other through a wire formed in one layer from among the first to fourth metal wire layers and the second metal pad layer and extending in a first horizontal direction and a second horizontal direction.

6. The non-volatile memory device of claim 1, wherein the second semiconductor layer further comprises first to fourth metal wire layers, and the first switch and the page buffer are connected to each other by wires formed in at least two layers selected from the first to fourth metal wire layers and the second metal pad layer.

7. The non-volatile memory device of claim 1, wherein the first switch and the second switch share a source/drain region corresponding to a node connected to the page buffer.

8. The non-volatile memory device of claim 1, wherein:

a portion of the page buffer is disposed to overlap the first cell region when viewed from the vertical direction, and the remaining portion of the page buffer is disposed to overlap the second cell region when viewed from the vertical direction.

9. The non-volatile memory device of claim 1, wherein:

the first switch and the second switch are arranged to overlap the second cell region when viewed from the vertical direction, and the page buffer is disposed to overlap the first cell region or the boundary region when viewed from the vertical direction.

10. The non-volatile memory device of claim 1, wherein:

the first switch is disposed to overlap the first cell region when viewed from the vertical direction, the second switch is disposed to overlap the second cell region when viewed from the vertical direction, and the page buffer is disposed to overlap the boundary region when viewed from the vertical direction.

11. The non-volatile memory device of claim 1, wherein:

the page buffer circuit further comprises:

a first cache latch connected to the page buffer and configured to input/output data for the first memory cell array; and a second cache latch connected to the page buffer and configured to input/output data for the second memory cell array.

12. The non-volatile memory device of claim 11, wherein:

the first cache latch is disposed to overlap the first cell region when viewed from the vertical direction, and the second cache latch is disposed to overlap the second cell region when viewed from the vertical direction.

13. The non-volatile memory device of claim 1, configured such that:

during a read operation or a program operation on the first memory cell array and the second memory cell array, a time period in which the first switch is turned on and a time period in which the second switch is turned on do not overlap, and, during an erase operation on the first memory cell array and the second memory cell array, a time period in which the first switch is turned on and a time period in which the second switch is turned on overlap each other.

14. The non-volatile memory device of claim 1, wherein the boundary region is a word line cut region between the first memory cell array and the second memory cell array.

15. The non-volatile memory device of claim 14, wherein the page buffer overlaps the boundary region when viewed from the vertical direction.

16. A non-volatile memory device comprising:

a first semiconductor layer comprising a first cell region in which a first memory cell array is disposed and a second cell region in which a second memory cell array is disposed, wherein the first memory cell array and the second memory cell array each comprises a plurality of word lines stacked in a vertical direction, a plurality of memory cells respectively connected to the plurality of word lines, and a plurality of bit lines, and wherein the first cell region is horizontally separated from the second cell region by a boundary region disposed therebetween; and a second semiconductor layer disposed under the first semiconductor layer and comprising a page buffer circuit region in which a page buffer circuit connected to the first memory cell array and the second memory cell array is disposed, wherein the page buffer circuit includes a page buffer, a first switch connected between the page buffer and a first bit line of the first memory cell array and a second switch connected between the page buffer and a second bit line of the second memory cell array, wherein the page buffer comprises a sensing latch connected to the first switch and the second switch in common, and wherein the first switch and the second switch are located in a region of the second semiconductor layer that vertically overlaps the boundary region.

17. The non-volatile memory device of claim 16, wherein the page buffer circuit further comprises:

a first cache latch connected to the page buffer and configured to input/output data for the first memory cell array; and a second cache latch connected to the page buffer and configured to input/output data for the second memory cell array.

18. The non-volatile memory device of claim 16, wherein the page buffer circuit comprises:

a first page buffer comprising a sensing latch connected to the first bit line;

a second page buffer comprising a sensing latch connected to the second bit line; and a cache latch connected to the first page buffer and the second page buffer.

19. The non-volatile memory device of claim 16, configured such that:

during a read operation or a program operation on the first memory cell array and the second memory cell array, a time period in which the first switch is turned on and a time period in which the second switch is turned on do not overlap, and, during an erase operation on the first memory cell array and the second memory cell array, a time period in which the first switch is turned on and a time period in which the second switch is turned on overlap each other.

20. A non-volatile memory device comprising:

a first memory cell array comprising a plurality of word lines and a plurality of first bit lines;

a second memory cell array comprising a plurality of word lines and a plurality of second bit lines, the second memory cell array horizontally separated from the first memory cell array by a boundary region disposed therebetween; and a page buffer circuit shared by the first memory cell array and the second memory cell array, wherein the page buffer circuit comprises:

a first switch connected between a page buffer and a first bit line of the first memory cell array;

a second switch connected between the page buffer and a second bit line of the second memory cell array; and the page buffer comprising a sensing latch connected to the first switch and the second switch in common, wherein at least one of the first switch and the second switch is below and vertically overlaps the boundary region.

* * * * *